United States Patent
Yim et al.

(10) Patent No.: US 12,424,601 B2
(45) Date of Patent: Sep. 23, 2025

(54) SEMICONDUCTOR PACKAGE AND MANUFACTURING METHOD THEREOF

(71) Applicant: SAMSUNG ELECTRONICS CO., LTD., Suwon-si (KR)

(72) Inventors: Choongbin Yim, Seoul (KR); Jinwoo Park, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 554 days.

(21) Appl. No.: 17/807,691

(22) Filed: Jun. 17, 2022

(65) Prior Publication Data

US 2022/0406766 A1 Dec. 22, 2022

(30) Foreign Application Priority Data

Jun. 18, 2021 (KR) .................. 10-2021-0079517

(51) Int. Cl.
*H01L 25/18* (2023.01)
*H01L 21/56* (2006.01)
(Continued)

(52) U.S. Cl.
CPC ............ *H01L 25/18* (2013.01); *H01L 21/563* (2013.01); *H01L 23/3121* (2013.01);
(Continued)

(58) Field of Classification Search
CPC . H01L 23/49811; H01L 25/18; H01L 25/105; H01L 21/563; H01L 24/32; H01L 23/24
See application file for complete search history.

(56) References Cited

U.S. PATENT DOCUMENTS 6,001,671 A   12/1999   Fjelstad
6,933,598 B2   8/2005   Karnezos
(Continued)

FOREIGN PATENT DOCUMENTS

JP        6007566         10/2016
KR   10-2019-0079065 A    7/2019

OTHER PUBLICATIONS

Office Action dated May 19, 2025 issued in corresponding Korean Patent Application No. 10-2021-0079517.

*Primary Examiner* — Moazzam Hossain
(74) *Attorney, Agent, or Firm* — Morgan, Lewis & Bockius LLP

(57) ABSTRACT

A semiconductor package includes: a package substrate; a semiconductor chip mounted above the package substrate; a chip connection terminal interposed between the semiconductor chip and the package substrate; an adhesive layer disposed on the package substrate and that covers a side and a top surface of the semiconductor chip and surrounds the chip connection terminal between the semiconductor chip and the package substrate; a molding layer disposed on the package substrate and that surrounds the adhesive layer; an interposer mounted on the adhesive layer and the molding layer, where the interposer includes an interposer substrate; and a conductive pillar disposed on the package substrate, where the conductive pillar surrounds the side of the semiconductor substrate, penetrates the molding layer in a vertical direction and connects the package substrate to the interposer substrate.

8 Claims, 21 Drawing Sheets

(51) Int. Cl.
*H01L 23/00* (2006.01)
*H01L 23/31* (2006.01)
*H01L 23/498* (2006.01)

(52) U.S. Cl.
CPC ........ *H01L 23/49811* (2013.01); *H01L 24/16* (2013.01); *H01L 24/29* (2013.01); *H01L 24/32* (2013.01); *H01L 24/73* (2013.01); *H01L 24/92* (2013.01); *H01L 2224/16227* (2013.01); *H01L 2224/2929* (2013.01); *H01L 2224/29386* (2013.01); *H01L 2224/32225* (2013.01); *H01L 2224/73204* (2013.01); *H01L 2224/92125* (2013.01)

(56) References Cited

U.S. PATENT DOCUMENTS

| | | |
|---|---|---|
| 7,053,476 B2 | 5/2006 | Karnezos |
| 7,855,342 B2 | 12/2010 | Sakamoto et al. |
| 8,106,495 B2 | 1/2012 | Kajiki |
| 8,174,119 B2 | 5/2012 | Pendse |
| 9,379,090 B1 | 6/2016 | Syed et al. |
| 9,406,636 B2 | 8/2016 | Zhao et al. |
| 10,229,894 B2 | 3/2019 | Huang et al. |
| 10,431,536 B2 | 10/2019 | Kim et al. |
| 10,607,971 B2 | 3/2020 | Im et al. |
| 10,825,780 B2 | 11/2020 | Wu et al. |
| 2019/0198437 A1* | 6/2019 | Kim .................. H01L 23/49833 |
| 2020/0105544 A1 | 4/2020 | Tsai et al. |
| 2021/0098421 A1* | 4/2021 | Wu .................. H01L 23/49811 |

\* cited by examiner

II-II'

SEMICONDUCTOR PACKAGE AND MANUFACTURING METHOD THEREOF

CROSS-REFERENCE TO RELATED APPLICATION

This application claims priority under 35 U.S.C. § 119 from Korean Patent Application No. 10-2021-0079517, filed on Jun. 18, 2021 in the Korean Intellectual Property Office, the contents of which are herein incorporated by reference in their entirety.

BACKGROUND

Technical Field

Embodiments of the inventive concept are directed to a semiconductor package, and more particularly, to a package-on-package type semiconductor package that includes a lower semiconductor package and an upper semiconductor package.

Discussion of the Related Art

As the storage capacity of semiconductor chips has increased, the thickness and weight of semiconductor packages, including semiconductor chips, has decreased. In addition, semiconductor chips that support additional functions in such semiconductor packages have been studied. In particular, package-on-package type semiconductor packages that have an upper semiconductor package mounted above a lower semiconductor package have been studied. For example, methods of improving the reliability of package-on-package type semiconductor packages have been actively studied.

SUMMARY

An embodiment of the inventive concept provides a package-on-package (PoP) type semiconductor package with improved structural reliability.

An embodiment of the inventive concept provides a PoP type semiconductor package with smaller thickness and weight.

An embodiment of the inventive concept provides a manufacturing method of a PoP type semiconductor package that has a reduced manufacturing time period and manufacturing cost.

According to an exemplary embodiment of the inventive concept, there is provided a semiconductor package that includes: a package substrate; a semiconductor chip mounted above the package substrate; a chip connection terminal interposed between the semiconductor chip and the package substrate and that connects the semiconductor chip and the package substrate; an adhesive layer disposed on the package substrate, wherein the adhesive layer covers a side and a top surface of the semiconductor chip and surrounds the chip connection terminal between the semiconductor chip and the package substrate; a molding layer disposed on the package substrate and that surrounds the adhesive layer; an interposer mounted on the adhesive layer and the molding layer, wherein the interposer includes an interposer substrate; and a conductive pillar disposed on the package substrate, wherein the conductive pillar surrounds the side of the semiconductor chip and penetrates the molding layer in a vertical direction and connects the package substrate to the interposer substrate.

According to an exemplary embodiment of the inventive concept, there is provided a package-on-package (PoP) type semiconductor package that includes a lower semiconductor package and an upper semiconductor package. The lower semiconductor package includes: a package substrate; a lower semiconductor chip mounted above the package substrate; a chip connection terminal interposed between the semiconductor chip and the package substrate and that connects the semiconductor chip to the package substrate; an adhesive layer that includes a first adhesive portion disposed on a package substrate and that surrounds the lower semiconductor chip, where the first adhesive portion is interposed between the package substrate and the lower semiconductor chip and surrounds the chip connection terminal; a second adhesive portion disposed adjacent to a side of the lower semiconductor chip; and a third adhesive portion disposed above a top surface of the lower semiconductor chip; a lower molding layer disposed on the package substrate and that surrounds the adhesive layer; an interposer mounted on the third adhesive portion of the adhesive layer and the lower molding layer, wherein the interposer includes an interposer substrate; and a conductive pillar disposed on the package substrate and that surrounds a side of the lower semiconductor chip and penetrates the lower molding layer in a vertical direction and connects the package substrate to the interposer substrate. The upper semiconductor package includes: a redistribution structure; an upper semiconductor chip mounted on the redistribution structure; and a package connection terminal disposed on the redistribution structure and that connects the upper semiconductor chip to the interposer substrate.

According to an exemplary embodiment of the inventive concept, there is provided a method of manufacturing a semiconductor package. The method includes: forming a semiconductor chip and a conductive pillar on a package substrate; fixing the semiconductor chip above the package substrate through an adhesive layer by heating and pressing the adhesive layer between the semiconductor chip and an interposer on the semiconductor chip; connecting the interposer to the package substrate; and forming a molding layer on the package substrate the outside of the adhesive layer.

According to an exemplary embodiment of the inventive concept, the adhesive layer of a semiconductor package includes a material that softens but does not completely dissolve or melt when heat is applied thereto. Accordingly, in a process of forming the adhesive layer on the package substrate, due to the fluidity of the adhesive layer, a space between the semiconductor chip and the package substrate and a space between the semiconductor chip and the interposer is filled with the adhesive layer without voids. Accordingly, the structural reliability between the semiconductor chip and the package substrate and the structural reliability between the semiconductor chip and the interposer substrate is increased.

In addition, according to an exemplary embodiment of the inventive concept, a manufacturing method of a semiconductor package fixes both the semiconductor chip and the package substrate to each other and the semiconductor chip and the interposer to each other through one adhesive layer. Accordingly, a manufacturing method of a semiconductor package according to an exemplary embodiment of the inventive concept has a shorter manufacturing duration and a lower manufacturing cost.

In addition, a semiconductor package manufactured by a manufacturing method according to an exemplary embodiment of the inventive concept is thinner and lighter.

DETAILED DESCRIPTION OF EMBODIMENTS

Hereinafter, embodiments of the inventive concept will be described in detail with reference to the accompanying drawings.

The term "about" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations as understood by one of the ordinary skill in the art. Further, it is to be understood that while parameters may be described herein as having "about" a certain value, according to embodiments, the parameter may be exactly the certain value or approximately the certain value within a measurement error as would be understood by a person having ordinary skill in the art.

Figure 1:
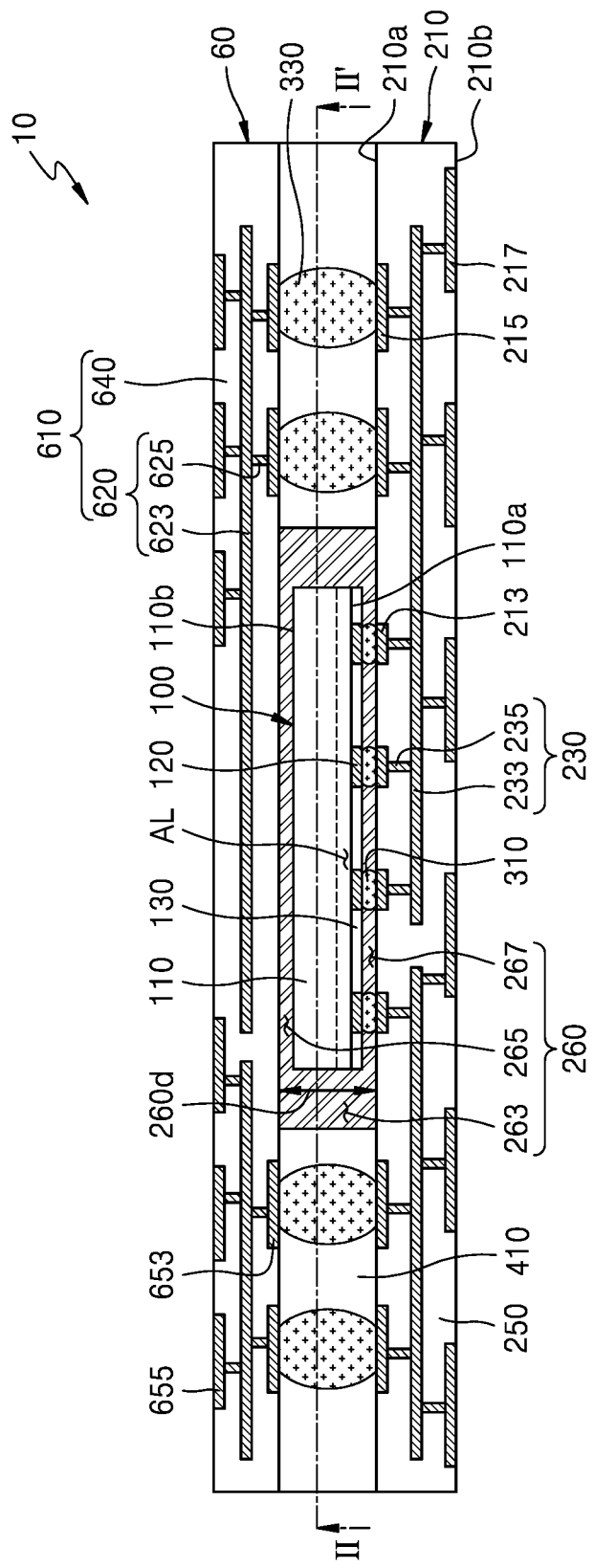
FIG. 1 illustrates a semiconductor package according to an embodiment of the inventive concept.
Figure 2:
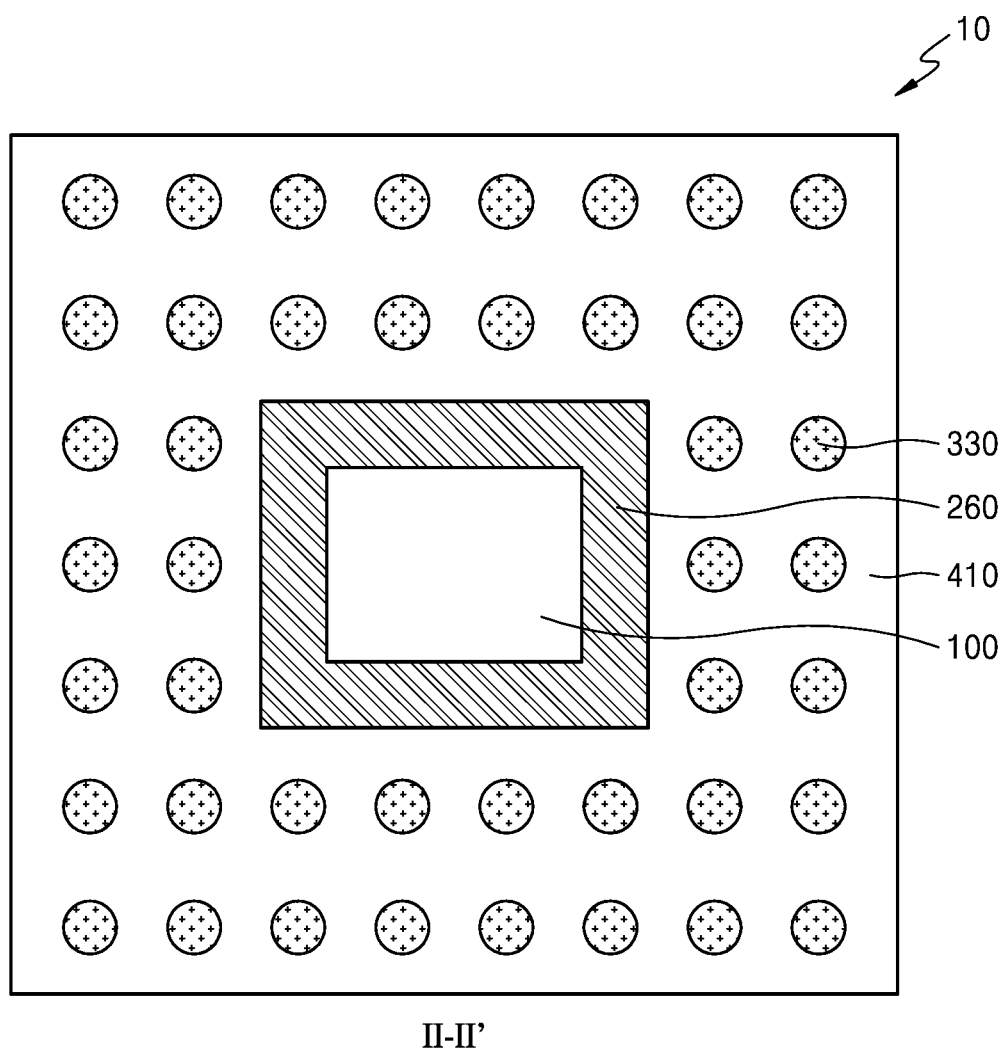
FIG. 2 is a cross-sectional view of a region II-II' in FIG. 1.

FIG. 1 illustrates a semiconductor package 10 according to an embodiment of the inventive concept. FIG. 2 is a cross-sectional view of a region II-II' shown in FIG. 1. The semiconductor package 10 shown in FIGS. 1 and 2 includes a lower semiconductor package that forms a package-on-package (PoP) type semiconductor package.

Referring to FIGS. 1 and 2, in an embodiment, the semiconductor package 10 includes a package substrate 210, a semiconductor chip 100, an adhesive layer 260, a chip connection terminal 310, a conductive pillar 330, a molding layer 410, an interposer 60, etc.

The package substrate 210 of the semiconductor package 10 includes a substrate for mounting the semiconductor chip 100 and connecting the semiconductor chip 100 to an external device. The package substrate 210 has atop surface 210a and a bottom surface 210b. For example, the top surface 210a of the package substrate 210 is a surface of the package substrate 210 above which the semiconductor chip 100 is mounted, and the bottom surface 210b is a surface of the semiconductor chip 100 opposite to the top surface 210a and is a surface to which an external connection terminal 510 (see FIG. 11) is attached.

In an exemplary embodiment, the package substrate 210 includes a double-sided printed circuit board (double-sided PCB) that includes a first package substrate pad 213 and a second package substrate 215 that are on the top surface 210a, and a third package substrate pad 217 on the bottom surface 210b. However, embodiments of the package substrate 210 are not limited to a structure and a material of a PCB, and other embodiments include various other kinds of substrates, such as a silicon substrate or a ceramic substrate.

In an exemplary embodiment, the package substrate 210 includes a package substrate insulating layer 250, a package substrate pattern 230, the first package substrate pad 213, the second package substrate pad 215, and the third package substrate pad 217.

In an exemplary embodiment, the package substrate insulating layer 250 includes an insulating layer that surrounds the package substrate pattern 230 and forms an exterior of the package substrate 210. For example, the package substrate insulating layer 250 includes a solder resist material layer.

In an exemplary embodiment, a material of the package substrate insulating layer 250 includes an oxide or a nitride. For example, the package substrate insulating layer 250 include silicon oxide or silicon nitride. However, embodiments of the material of the package substrate insulating layer 250 are not limited thereto.

In an exemplary embodiment, the package substrate pattern 230 includes a package substrate line pattern 233 that extends in a first or horizontal direction in the package substrate insulating layer 250, and a package substrate via pattern 235 that extending in a second or vertical direction in the package substrate insulating layer 250.

The first or horizontal direction is a direction parallel to an extension direction of the top surface 210a and the bottom surface 210b of the package substrate 210, and the second or vertical direction is perpendicular to the horizontal direction and to the extension direction of the top surface 210a and the bottom surface 210b of the package substrate 210.

In an exemplary embodiment, a material of the package substrate pattern 230 includes copper (Cu). However, the material of the package substrate pattern 230 is not limited thereto and in other embodiments includes a metal such as nickel (Ni), gold (Au), silver (Ag), aluminum (Al), tungsten (W), titanium (Ti), tantalum (Ta), indium (In), molybdenum (Mo), manganese (Mn), cobalt (Co), tin (Sn), magnesium (Mg), rhenium (Re), beryllium (Be), gallium (Ga), or ruthenium (Ru), or an alloy thereof.

In an exemplary embodiment, the first package substrate pad 213 includes a pad located on the top surface 210a of the package substrate 210 and that is configured to connect a plurality of individual devices in the semiconductor chip 100 to the package substrate pattern 230.

In addition, the second package substrate pad 215 includes a pad on the top surface 210a of the package substrate 210 that spaced apart from the first package substrate pad 213 and is configured to connect the conductive pillar 330 to the package substrate pattern 230.

In addition, the third package substrate pad 217 is located on the bottom surface 210b of the package substrate 210 and is configured to connect the external connection terminal 510 (see FIG. 11) to the package substrate pattern 230.

The semiconductor chip 100 is mounted above the top surface 210a of the package substrate 210. In an exemplary embodiment, the semiconductor chip 100 includes a semiconductor substrate 110 that has an active layer AL, a chip pad 120, a passivation layer 130, etc.

In an exemplary embodiment, the semiconductor chip 100 includes a memory semiconductor chip. The memory semiconductor chip may be, for example, a volatile memory semiconductor chip such as a dynamic random access memory (DRAM) or a static random access memory (SRAM), and may also be a non-volatile memory semiconductor chip such as a phase-change random access memory (PRAM), a magneto-resistive random access memory (MRAM), a ferroelectric random access memory (FeRAM), or a resistive random access memory (RRAM).

In an exemplary embodiment, the semiconductor chip 100 includes a logic semiconductor chip. The logic semiconductor chip may be, for example, a central processor unit (CPU), a micro processor unit (MPU), a graphic processor unit (GPU), or an application processor (AP).

Although FIG. 1 illustrates that the semiconductor package 10 includes one semiconductor chip 100, the number of semiconductor chip 100 is not limited thereto, and in other embodiments, the semiconductor chip 10 includes two or more semiconductor chips. In some embodiments, the semiconductor package 10 includes a plurality of semiconductor chips, and includes a system in package (SIP) type semiconductor in which a plurality of different semiconductor chips are electrically connected to one another and operate as a system.

The semiconductor substrate 110 of the semiconductor chip 100 has a first surface 110a and a second surface 110b. The first surface 110a of the semiconductor substrate 110 faces the package substrate 210, and is the surface to which the chip pad 120 is attached, and the second surface 110b of the semiconductor substrate 110 is opposite to the first surface 110a.

In an exemplary embodiment, the semiconductor substrate 110 includes silicon (Si). In addition, the semiconductor substrate 110 may include a semiconductor element such as germanium (Ge), or a compound semiconductor such as silicon carbide (SiC), gallium arsenide (GaAs), indium arsenide (InAs), or indium phosphide (InP). However, the material of the semiconductor substrate 110 is not limited thereto.

In an exemplary embodiment, the active area AL of the semiconductor substrate 110 is located adjacent to the first surface 110a. In other words, the active layer AL of the semiconductor chip 100 is a portion of the semiconductor substrate 110a that is adjacent to the top surface 210a of the package substrate 210.

In an exemplary embodiment, the active layer AL includes a plurality of individual devices. For example, the plurality of individual devices includes various micro electronic devices, such as a complementary metal-oxide semiconductor (CMOS) transistor, a metal-oxide-semiconductor field effect transistor (MOSFET), a system large scale integration (system LSI), an image sensor such as a CMOS imaging sensor, a micro-electro-mechanical system (MEMS), an active element, or a passive element, etc.

The chip pad 120 of the semiconductor chip 100 is located on the first surface 110a of the semiconductor substrate 110 and is electrically connected to the plurality of individual devices in the active layer AL. As shown in FIG. 1, a plurality of the chip pads 120 of the semiconductor chip 100 are provided.

The passivation layer 130 of the semiconductor chip 100 includes a layer that covers a side of the chip pad 120 on the first surface 110a of the semiconductor substrate 110. In addition, the passivation layer 130 exposes a bonding surface of the chip pad 120. The bonding surface of the chip pad 120 is in contact with the chip connection terminal 310.

In an exemplary embodiment, a material of the passivation layer 130 includes silicon nitride (SiN). However, the material of the passivation layer 130 is not limited thereto and in other embodiments includes silicon oxynitride (SiON), silicon dioxide ($SiO_2$), silicon oxycarbonitride (SiOCN), silicon carbonitride (SiCN), or a combination thereof.

The chip connection terminal 310 is disposed between the semiconductor chip 100 and the package substrate 210 and is configured to electrically connect each of the plurality of individual devices in the semiconductor chip 100 to the package substrate pattern 230 of the package substrate 210. In detail, the chip connection terminal 310 is located between the chip pad 120 of the semiconductor chip 100 and the first package substrate pad 213 of the package substrate 210 and electrically connects the chip pad 120 to the first package substrate pad 213.

In an exemplary embodiment, the semiconductor chip 100 is attached onto the package substrate 210 through a flip-chip bonding process that uses the chip connection terminal 310.

In an exemplary embodiment, the chip connection terminal 310 includes a solder ball made of a metal that includes at least one of Sn, Ag, Cu, or Al.

The adhesive layer 260 is disposed on the package substrate 210 and covers a top surface and side surfaces of the semiconductor chip 100. In addition, the adhesive layer 260 fixes the semiconductor chip 100 above the package substrate 210, i.e., to the top surface 210a of the package substrate 210.

In an exemplary embodiment, the adhesive layer 260 includes a first adhesive portion 263, a second adhesive portion 265, and a third adhesive portion 267.

The first adhesive portion 263 is a portion of the adhesive layer 260 that is interposed between the bottom surface of the semiconductor chip 100 and the top surface 210a of the package substrate 210 and surrounds the chip connection terminal 310. The second adhesive portion 265 is a portion of the adhesive layer 260 located adjacent to the side of the semiconductor chip 100. In addition, the third adhesive portion 267 is a portion of the adhesive layer 260 interposed between the top surface of the semiconductor chip 100 and a bottom surface of an interposer substrate 610, i.e., between the top surface 110b of the semiconductor substrate 110 and the bottom surface of the interposer substrate 610.

In an exemplary embodiment, the adhesive layer 260 includes a material that softens but does not completely dissolve or melted when heat is applied, such as a b-stage state.

In an exemplary embodiment, the adhesive layer 260 includes a binder material and a curing material. For example, the binder material of the adhesive layer 260 includes at least one of an acrylic polymer resin or an epoxy resin. In addition, the curing material of the adhesive layer 260 includes at least one of an epoxy resin, a phenolic curing resin, or a phenoxy resin. In addition, the adhesive layer 260 further includes a curing catalyst, an additive such as silane coupling agent, and a filler such as silica.

In an exemplary embodiment, the adhesive layer 260 includes a die attach film (DAF) that softens but does not completely dissolve or melt when heat is applied thereto.

In an exemplary embodiment, a thickness 260d of the adhesive layer 260 ranges from about 50 micrometers to about 1000 micrometers. The thickness 260d of the adhesive layer 260 is a length in the vertical direction of the adhesive layer 260.

In addition, the thickness 260d of the adhesive layer 260 is greater than a thickness of the semiconductor chip 100. For example, the thickness of the semiconductor chip 100 ranges from about 20 micrometers to about 500 micrometers, and the thickness 260d of the adhesive layer 260 has a value greater than the thickness of the semiconductor chip 100 in a range from about 50 micrometers to about 1000 micrometers.

In addition, the thickness 260d of the adhesive layer 260 ranges from about 1.2 times to about 2.5 times the thickness of the semiconductor chip 100. When the thickness 260d of the adhesive layer 260 is less than about 1.2 times the thickness of the semiconductor chip 100, the thickness 260d of the adhesive layer 260 between the semiconductor chip 100 and the interposer substrate 610 decreases, and accordingly, the adhesion performance between the semiconductor chip 100 and the interposer substrate 610 deteriorates. In addition, when the thickness 260d of the adhesive layer 260 is greater than 2.5 times the thickness of the semiconductor chip 100, a length in the vertical direction of the semiconductor package 10 increases, and the weight of the semiconductor package 10 increases.

In an exemplary embodiment, a bottom surface of the adhesive layer 260 is coplanar with the top surface 210a of the package substrate 210. In addition, a top surface of the adhesive layer 260 is coplanar with a top surface of the molding layer 410 and the bottom surface of the interposer substrate 610.

In an exemplary embodiment, the molding layer 410 is disposed on the package substrate 210 and surrounds side surfaces of the adhesive layer 260. In addition, the molding layer 410 prevents short-cuts between the plurality of conductive pillars 330 and fixes the interposer 60 onto the adhesive layer 260.

In an exemplary embodiment, a bottom surface of the molding layer 410 is coplanar with the top surface 210a of the package substrate 210, and a top surface of the molding layer 410 is coplanar with the bottom surface of the interposer substrate 610 and the top surface of the adhesive layer 260. In addition, a side of the molding layer 410 is coplanar with a side of the package substrate 210 and a side of the interposer substrate 610.

In an exemplary embodiment, the material of the molding layer 410 differs from the material of the adhesive layer 260. Accordingly, a boundary plane forms where the molding layer 410 and the adhesive layer 260 contact each other.

In an exemplary embodiment, the molding layer 410 includes at least one of a conductive polymer or an epoxy resin. For example, the molding layer 410 includes an epoxy molding compound (EMC).

The conductive pillar 330 is disposed on the top surface 210a of the package substrate 210 and surrounds an edge of the semiconductor chip 100. In detail, the conductive pillar 330 is formed of a conductive material that is disposed on the second package substrate pad 215 of the package substrate 210.

In an exemplary embodiment, the conductive pillar 330 is integrally formed with an interposer connection layer 630 (see FIG. 15) of the interposer 60 to be described below. In addition, a material of the conductive pillar 330 may include at least one of Sn, Ag, Cu, and Al.

In an exemplary embodiment, a cross-section in a horizontal direction of the conductive pillar 330 has a circular shape. However, the shape of the horizontal cross-section of the conductive pillar 330 is not limited to the shape stated above. In other embodiments, the horizontal cross-section of the conductive pillar 330 has a polygonal shape.

In an exemplary embodiment, a vertical length of the conductive pillar 330 is substantially equal to a vertical length of the molding layer 410 and the vertical length of the adhesive layer 260.

The interposer 60 supports an upper semiconductor package 90 (see FIG. 11) and electrically connects the upper semiconductor package 90 to the package substrate 210. The interposer 60 includes the interposer substrate 610, a first interposer substrate pad 653, and a second interposer substrate pad 655.

The interposer substrate 610 is at least one of a carrier, a PCB, or a wafer. In addition, the interposer substrate 610 includes an interposer substrate pattern 620 and an interposer insulating layer 640 that surrounds the interposer substrate pattern 620.

The interposer substrate pattern 620 includes an interposer substrate line pattern 623 that extends in the first or horizontal direction in the interposer insulating layer 640 and an interposer substrate via pattern 625 that extends in the second or vertical direction in the interposer insulating layer 640.

A material of the interposer substrate pattern 620 includes Cu. However, the material of the interposer substrate pattern 620 is not limited thereto and may include a metal such as Ni, Au, Ag, Al, W, Ti, Ta, In, Mo, Mn, Co, Sn, Mg, Re, Be, Ga, or Ru, or an alloy thereof.

The interposer insulating layer 640 is a layer formed of a conductive material that surrounds the interposer substrate pattern 620. In addition, the interposer insulating layer 640 forms an exterior of the interposer substrate 610. In an exemplary embodiment, the material of the interposer insulating layer 640 includes an oxide or a nitride. For example, the interposer insulating layer 640 includes silicon oxide or silicon nitride.

The first interposer substrate pad 653 is located on the bottom surface of the interposer substrate 610 and connects the interposer substrate pattern 620 to the conductive pillar 330. In addition, the second interposer substrate pad 655 is located on a top surface of the interposer substrate 610 and connects the interposer substrate pattern 620 to a package connection terminal 1300 (see FIG. 11) of the upper semiconductor package 90 (see FIG. 11).

In an exemplary embodiment, in a process of mounting the interposer 60 on the package substrate 210, an interposer connection terminal 630 (see FIG. 16) of the interposer 60 is combined and integrated with the conductive pillar 330 of the semiconductor package 10.

The semiconductor package 10 according to an exemplary embodiment of the inventive concept provides the adhesive layer 260 that includes: a first adhesive portion 263 interposed between the semiconductor chip 100 and the package substrate 210 and that adheres the semiconductor chip 100 and the package substrate 210 to each other; and a third adhesive portion 267 interposed between the semiconductor chip 100 and the interposer substrate 610 and that adheres the semiconductor chip 100 and the interposer substrate 610 to each other.

In addition, the adhesive layer 260 includes a material that softens but does not completely dissolve or melt when heat is applied thereto. Therefore, in a process of forming the adhesive layer 260, a space between the semiconductor chip 100 and the package substrate 210 and a space between the semiconductor chip 100 and the interposer substrate 610 is filled with the adhesive layer 260 without voids.

Accordingly, a structural reliability between the semiconductor chip 100 and the package substrate 210 and the structural reliability between the semiconductor chip 100 and the interposer substrate 610 is increased.

Figure 3:
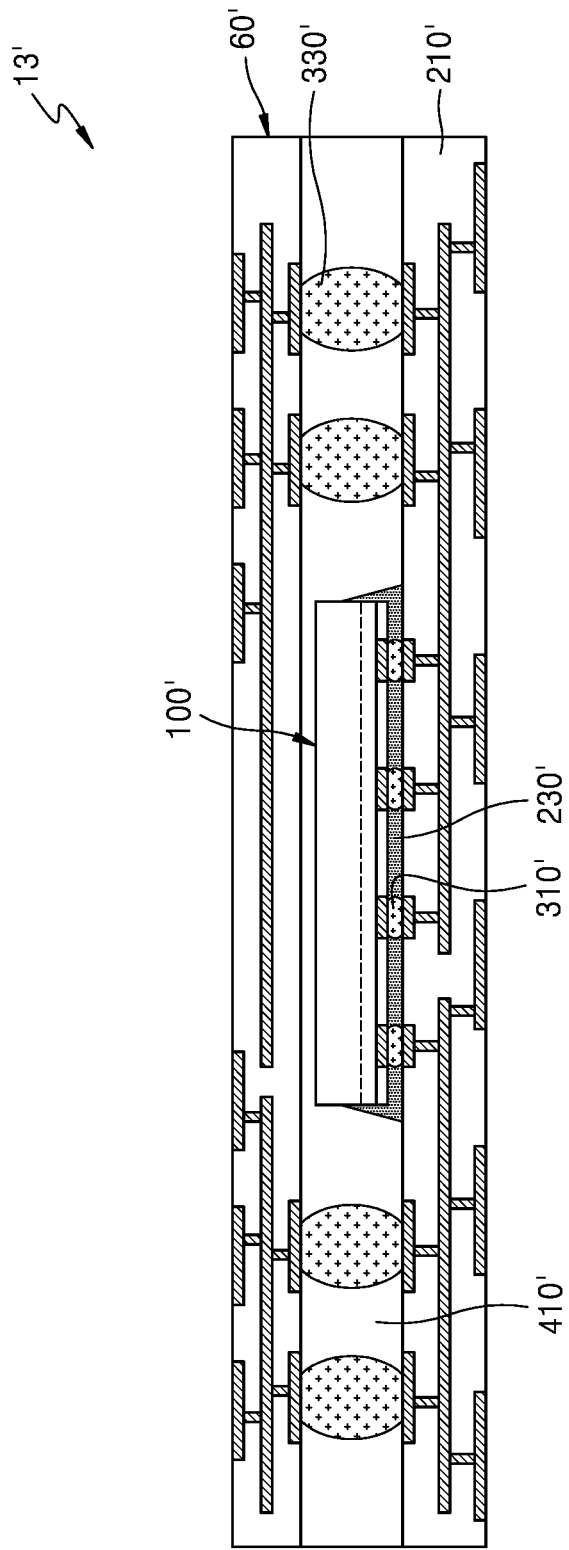
FIG. 3 is a cross-sectional view of a semiconductor package according to a Comparative Example.

FIG. 3 is a cross-sectional view of a semiconductor package 13' according to a comparative example.

The semiconductor package 13' according to the comparative example includes a package substrate 210', a semiconductor chip 100', an underfill member 230', a chip connection terminal 310', a conductive pillar 330', a molding layer 410', an interposer 60', etc.

Referring to FIG. 3, the underfill member 230' is interposed between the semiconductor chip 100' and the package substrate 210'. In detail, after the semiconductor chip 100' is disposed on the package substrate 210', the underfill member 230' is interposed between the semiconductor chip 100' and the package substrate 210'.

As the semiconductor package 13' is designed to be thinner and lighter in weight, a vertical distance between the semiconductor chip 100' and the package substrate 210' gradually decreases. Accordingly, in a process of injecting the underfill member 230' between the semiconductor chip 100' and the package substrate 210', a space between the semiconductor chip 100' and the package substrate 210' might not be completely filled with the underfill member 230', and voids may form in the space. That is, the structural reliability between the semiconductor chip 100' and the package substrate 210' may be weak.

In addition, as the semiconductor 13' is designed to be thinner and lighter, a vertical distance between the semiconductor chip 100' and the interposer 60' gradually decreases. Accordingly, in a process of injecting the molding layer 410' between the package substrate 210' and the interposer 60', a space between the package substrate 210' and the interposer 60' might not be completely filled with the molding layer 410', and voids may form in the space. That is, the structural reliability between the semiconductor chip 100' and the interposer 60' may be weak.

However, the semiconductor package 10 described with reference to FIGS. 1 and 2 includes the adhesive layer 260 that includes a material that softens but does not completely dissolve or melt when heat is applied thereto. Accordingly, in a process of forming the adhesive layer 260 (see FIG. 1) on the package substrate 210 (see FIG. 1), the space between the semiconductor chip 100 and the package substrate 210 and the space between the semiconductor chip 100 and the interposer substrate 610 is filled with the adhesive layer 260 without voids. That is, the structural reliability between the semiconductor chip 100 and the package substrate 210 and the structural reliability between the semiconductor chip 100 and the interposer substrate 610 is increased.

Figure 4:
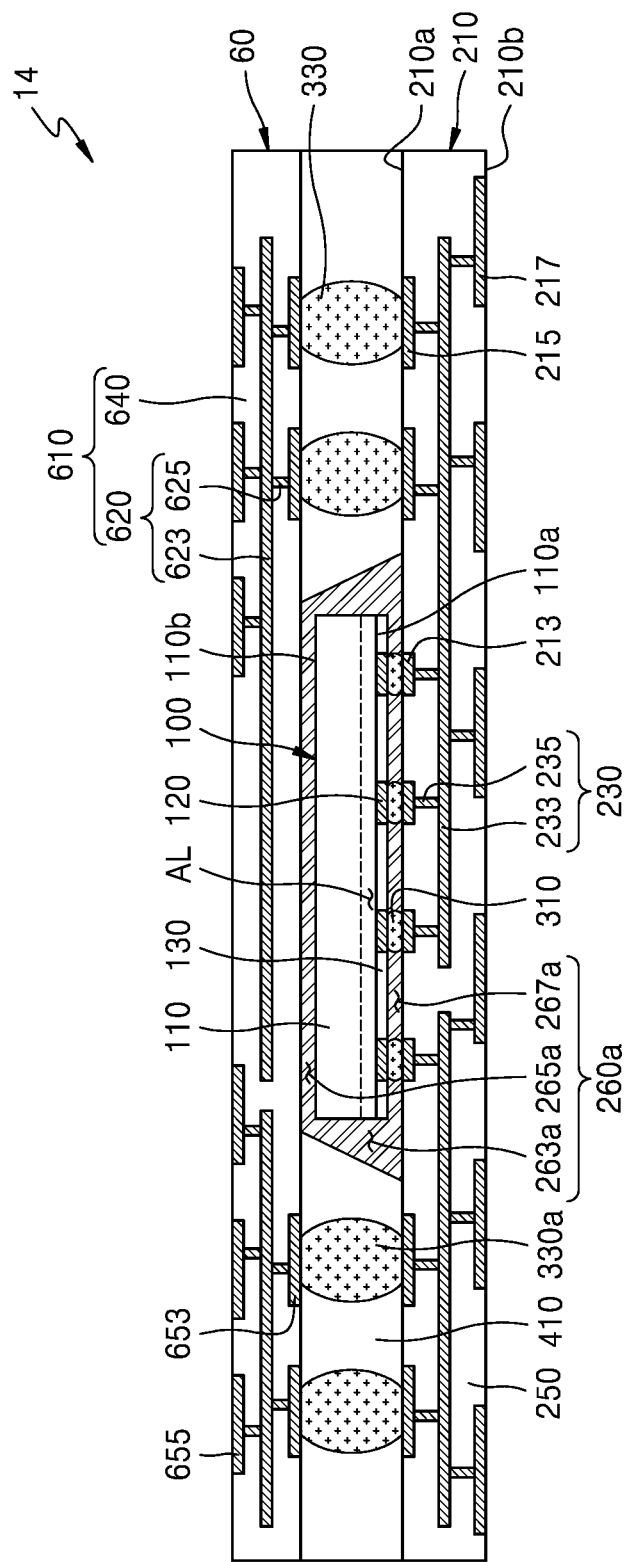
FIG. 4 is a cross-sectional view of a semiconductor package according to an exemplary embodiment of the inventive concept.

FIG. 4 is a cross-sectional view of a semiconductor package 14 according to an exemplary embodiment of the inventive concept.

Hereinafter, repeated descriptions regarding the semiconductor package 10 of FIG. 1 are omitted, and differences therebetween will be mainly described.

Referring to FIG. 4, in an embodiment, the semiconductor package 14 includes the package substrate 210, the semiconductor chip 100, an adhesion layer 260a, the chip connection terminal 310, the conductive pillar 330, the molding layer 410, the interposer 60, etc.

The adhesion layer 260a includes: a first adhesion portion 263a that is interposed between the bottom surface of the semiconductor chip 100 and the top surface 210a of the package substrate 210 and that surrounds the chip connection terminal 310; a second adhesive portion 265a disposed adjacent to the sides of the semiconductor chip 100; and a third adhesive portion 267a interposed between the top surface of the semiconductor chip 100 and the bottom surface of the interposer substrate 610.

In an exemplary embodiment, the second adhesive portion 265a has a tapered shape of which a cross-sectional area in a horizontal direction decreases in a vertical direction away from the package substrate 210 and toward the interposer substrate 610. That is, a side surface of the second adhesive portion 265a is slanted, i.e., not perpendicular, with respect to the top surface 210a of the package substrate 210. For example, the side surface of the second adhesive portion 265a is slanted toward the top surface of the semiconductor chip 100. For example, the adhesive layer 260a has a truncated conical shape or rectangular pyramid shape. In addition, a cross-section in a vertical direction of the adhesion layer 260a has a trapezoidal shape of which a length of a top edge is less than a length of a bottom edge.

In addition, a boundary surface between the adhesion layer 260a and the molding layer 410 is formed between a conductive pillar 330a closest to the semiconductor chip 100 and the side of the semiconductor chip 100. In addition, the boundary surface is inclined from the top surface 210a of the package substrate 210.

Figure 5:
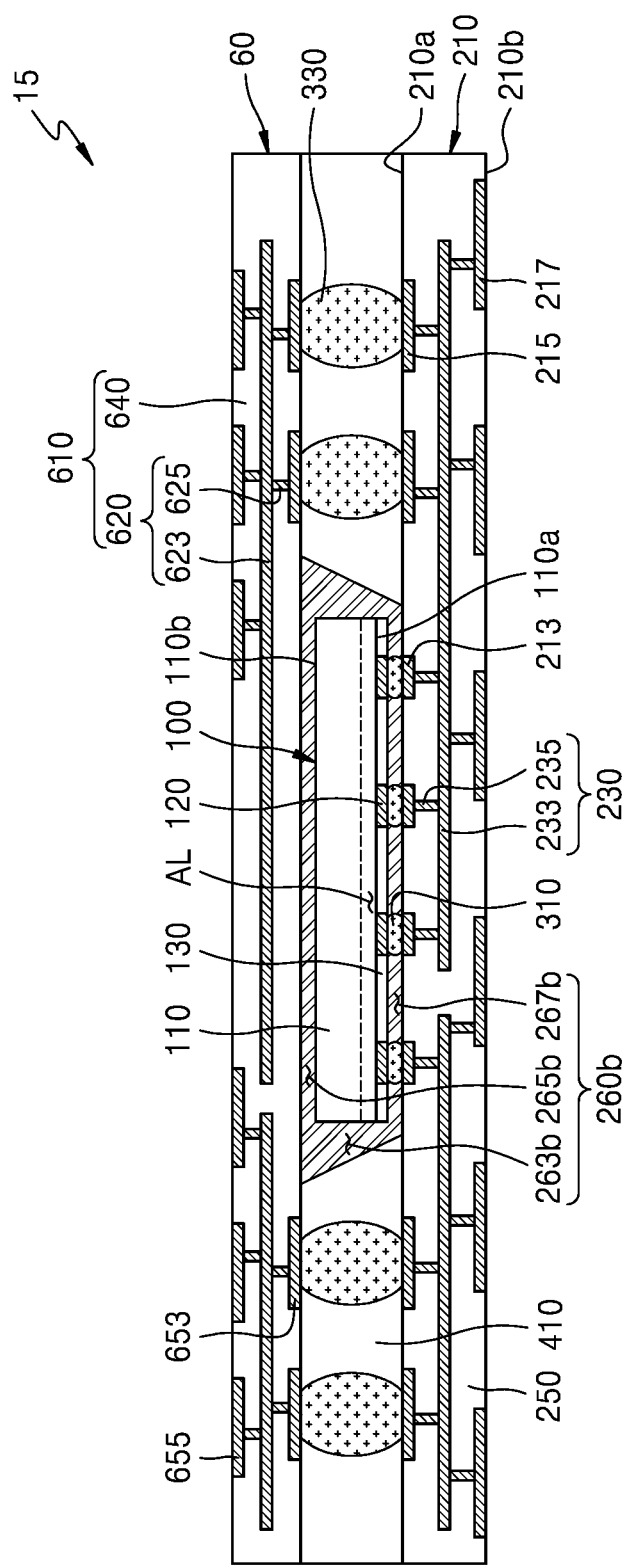
FIG. 5 is a cross-sectional view of a semiconductor package according to an exemplary embodiment of the inventive concept.

FIG. 5 is a cross-sectional view of a semiconductor package 15 according to an exemplary embodiment of the inventive concept.

Hereinafter, repeated descriptions regarding the semiconductor package 10 of FIG. 1 are omitted, and differences therebetween will be mainly described.

Referring to FIG. 5, in an embodiment, the semiconductor package 15 includes the package substrate 210, the semiconductor chip 100, an adhesive layer 260b, the chip connection terminal 310, the conductive pillar 330, the molding layer 410, the interposer 60, etc.

The adhesive layer 260b includes: a first adhesive portion 263b that is interposed between the bottom surface of the semiconductor chip 100 and the top surface 210a of the package substrate 210 and that surrounds the chip connection terminal 310; a second adhesive portion 265b disposed adjacent to the sides of the semiconductor chip 100; and a third adhesive portion 267b interposed between the top surface of the semiconductor chip 100 and the bottom surface of the interposer substrate 610.

In an exemplary embodiment, the second adhesive portion 265b has a tapered shape of which a cross-sectional area in the horizontal direction increases in the vertical direction away from the package substrate 210 and toward the interposer substrate 610. That is, a side surface of the second adhesive portion 265a is slanted, i.e., not perpendicular, with respect to the top surface 210a of the package substrate 210. For example, the side surface of the second adhesive portion 265b is slanted toward the bottom surface of the semiconductor chip 100. For example, the adhesive layer 260b has a reverse-truncated conical or a reverse-rectangular pyramid shape. In addition, a cross-section of the adhesive layer 260b in the vertical direction has a trapezoidal shape of which a length of a top edge is greater than a length of a bottom edge.

Figure 6:
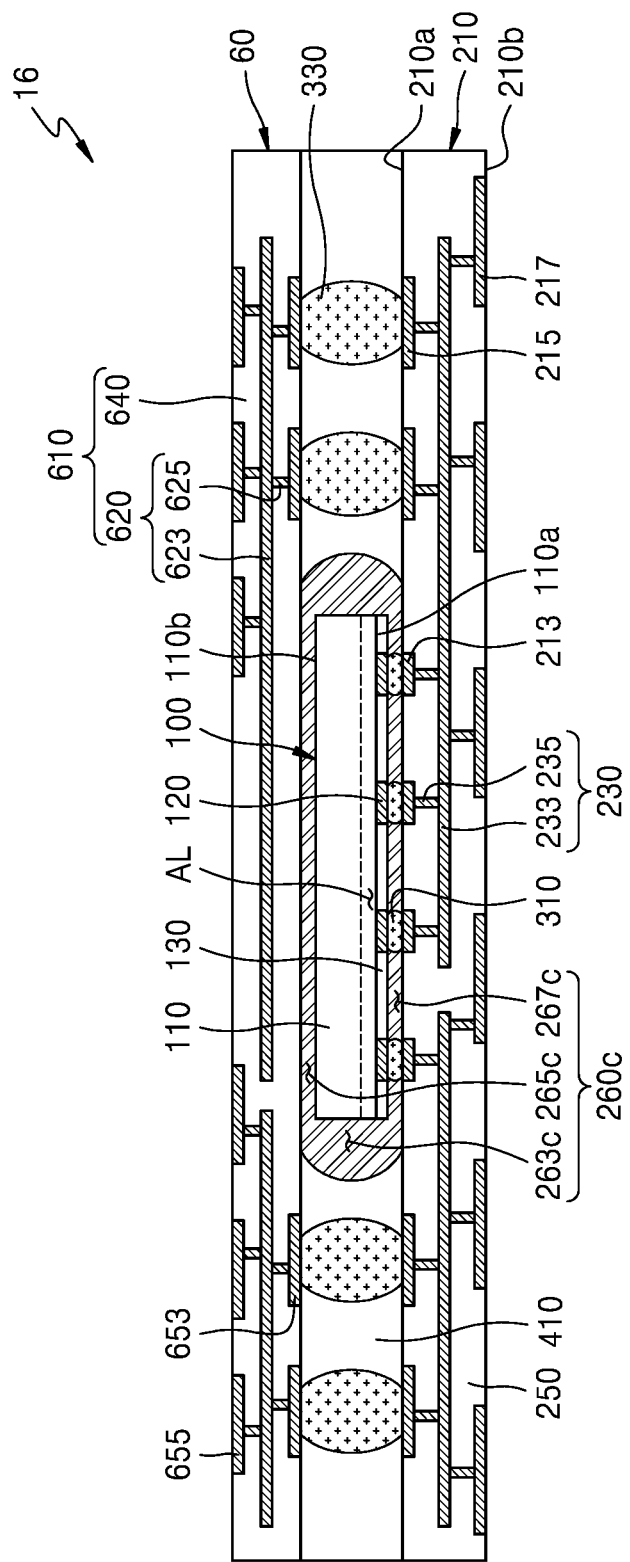
FIG. 6 is a cross-sectional view of a semiconductor package according to an exemplary embodiment of the inventive concept.

FIG. 6 is a cross-sectional view of a semiconductor package 16 according to an exemplary embodiment of the inventive concept.

Hereinafter, repeated descriptions regarding the semiconductor package 10 of FIG. 1 are omitted, and differences therebetween will be mainly described.

Referring to FIG. 6, in an embodiment, the semiconductor package 16 includes the package substrate 210, the semiconductor chip 100, an adhesive layer 260c, the chip connection terminal 310, the conductive pillar 330, the molding layer 410, the interposer 60, etc.

The adhesive layer 260c includes: a first adhesive portion 263c that is interposed between the bottom surface of the semiconductor chip 100 and the top surface 210a of the package substrate 210 and that surrounds the chip connection terminal 310; a second adhesive portion 265c disposed adjacent to the sides of the semiconductor chip 100; and a third adhesive portion 267c interposed between the top surface of the semiconductor chip 100 and the bottom surface of the interposer substrate 610.

In an exemplary embodiment, the second adhesive portion 265c has ajar shape of which a cross-sectional area in the horizontal direction first increases and then decreases away from the package substrate 210 in the vertical direction. That is, a side surface of the second adhesive portion 265c is curved concave outward away from the sides of the semiconductor chip 100.

Figure 7:
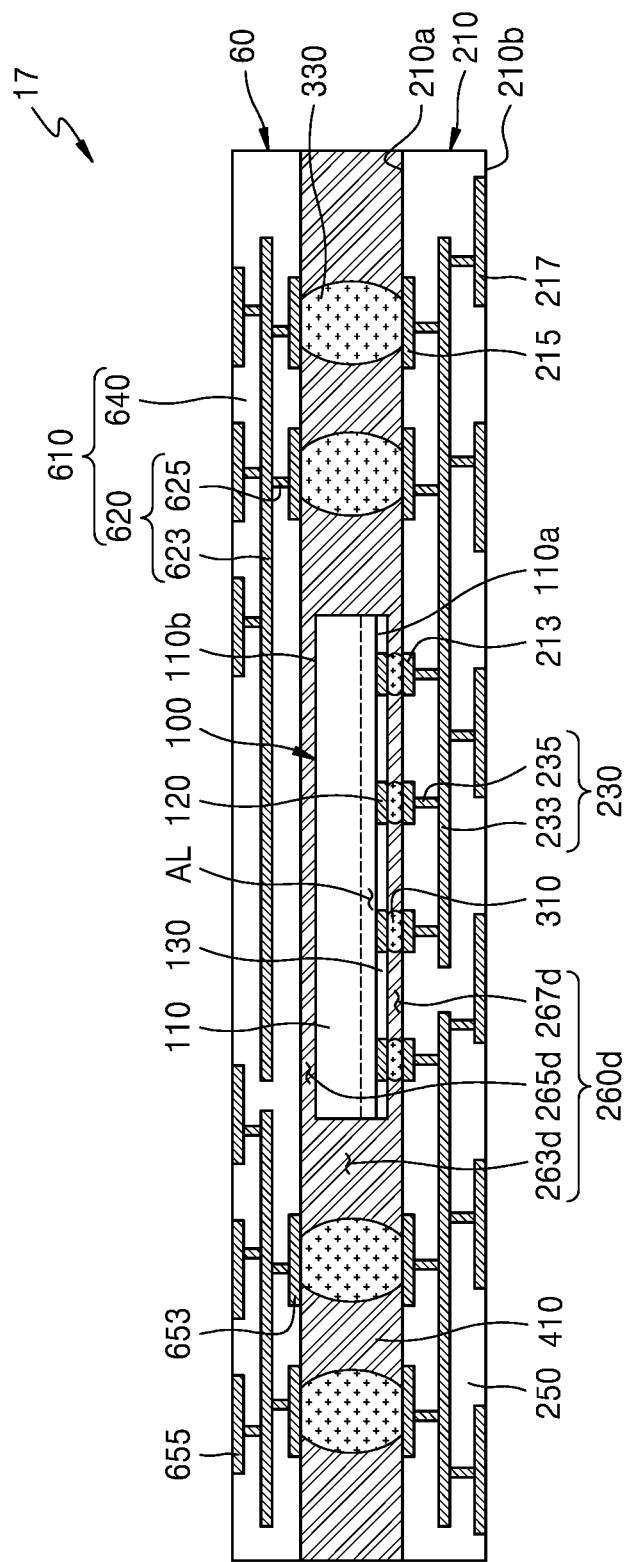
FIG. 7 is a cross-sectional view of a semiconductor package according to an exemplary embodiment of the inventive concept.

FIG. 7 is a cross-sectional view of a semiconductor package 17 according to an exemplary embodiment of the inventive concept.

Hereinafter, repeated descriptions regarding the semiconductor package 10 of FIG. 1 will be omitted, and differences therebetween will be mainly described.

Referring to FIG. 7, in an embodiment, the semiconductor package 17 includes the package substrate 210, the semiconductor chip 100, an adhesive layer 260d, the chip connection terminal 310, the conductive pillar 330, the interposer 60, etc.

The adhesive layer 260d includes: a first adhesive portion 263d that is interposed between the bottom surface of the semiconductor chip 100 and the top surface 210a of the package substrate 210 and that surrounds the chip connection terminal 310; a second adhesive portion 265d that is disposed adjacent to the sides of the semiconductor chip 100 and that surrounds the conductive pillar 330; and a third adhesive portion 267d interposed between the top surface of the semiconductor chip 100 and the bottom surface of the interposer substrate 610.

That is, the adhesive layer 260d of the semiconductor package 17 of FIG. 7 is interposed between the package substrate 210 and the interposer 60 and fills a space between the package substrate 210 and the semiconductor chip 100 and a space between the semiconductor chip 100 and the interposer 60. In addition, the adhesive layer 260d covers the conductive pillar 330 outside of the semiconductor chip 100.

In an exemplary embodiment, a side of the adhesive layer 260d is coplanar with the side of the interposer substrate 610 and the side of the package substrate 210. In addition, a length in a horizontal direction of the adhesive layer 260d is substantially equal to a length in a horizontal direction of the package substrate 210 and a length in a vertical direction of the interposer substrate 610, and a length in a vertical direction of the adhesive layer 260d is substantially equal to a length in a vertical direction of the conductive pillar 330.

Figure 8:
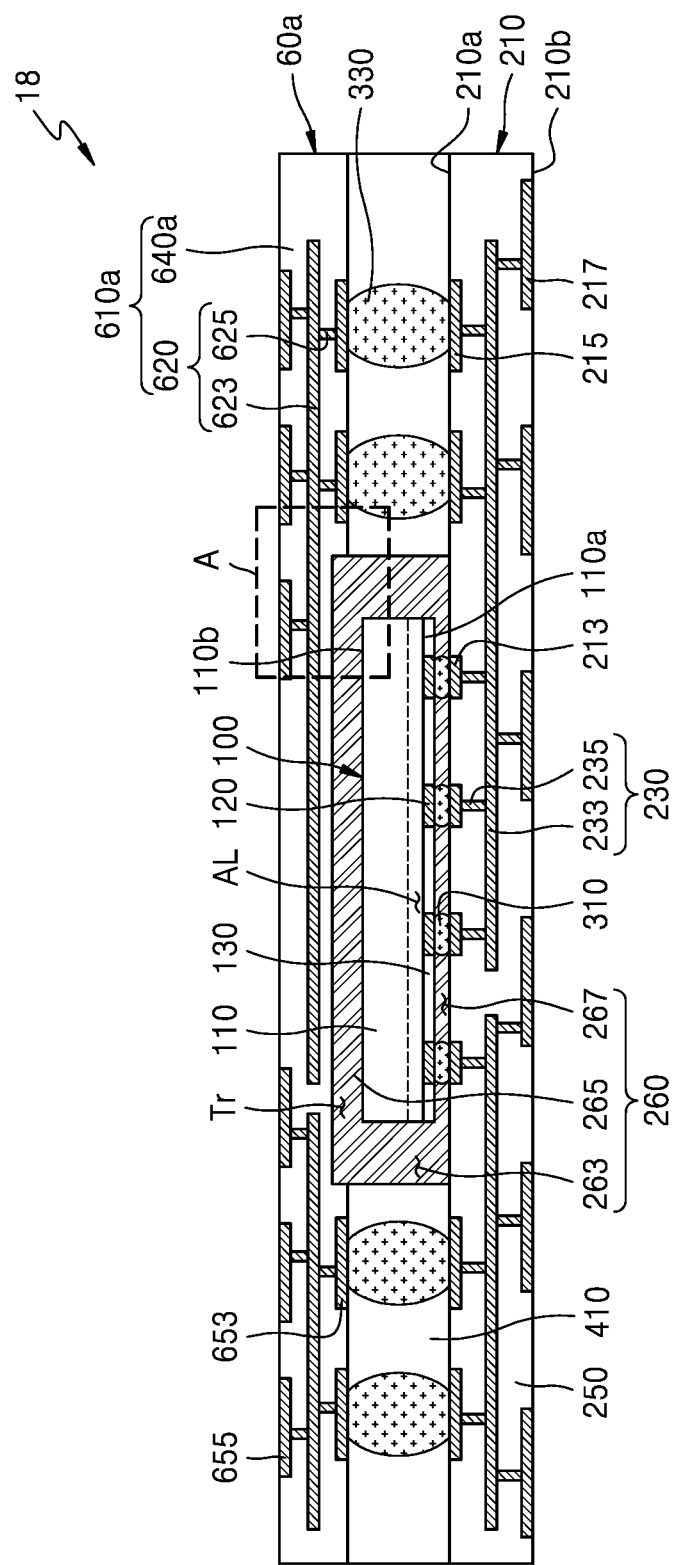
FIG. 8 is a cross-sectional view of a semiconductor package according to an exemplary embodiment of the inventive concept.
Figure 9:
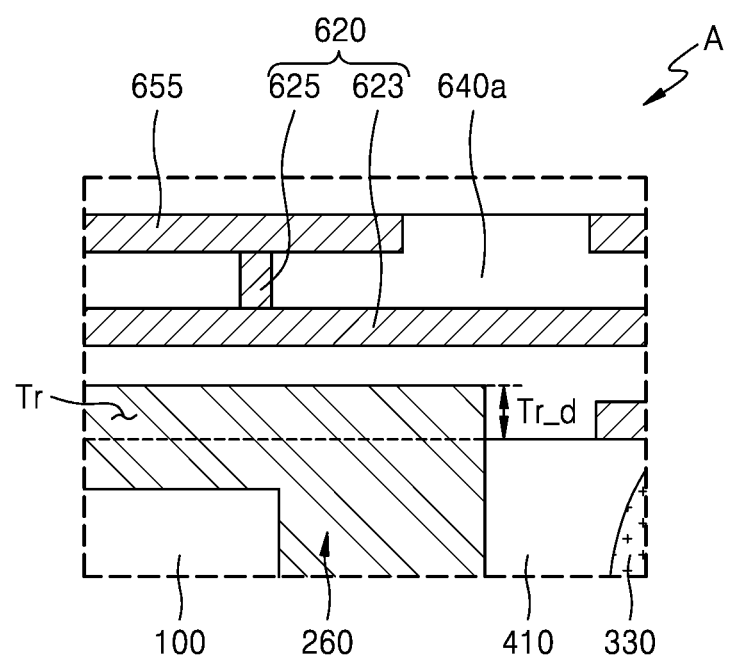
FIG. 9 is an enlarged view of a region "A" in FIG. 8.

FIG. 8 is a cross-sectional view of a semiconductor package 18 according to an exemplary embodiment of the inventive concept. FIG. 9 is an enlarged view of a region "A" shown in FIG. 8.

Hereinafter, repeated descriptions regarding the semiconductor package 10 of FIG. 1 will be omitted, and differences therebetween will be mainly described.

Referring to FIGS. 8 and 9, in an embodiment, an interposer 60a of the semiconductor package 18 may include an interposer substrate 610a, the first interposer substrate pad 653, and the second interposer substrate pad 655. In addition, the interposer substrate 610a includes the interposer substrate pattern 620 and an interposer insulating layer 640a that surrounds the interposer substrate pattern 620.

In an exemplary embodiment, the interposer 60a includes, at a bottom portion thereof, a trench Tr that accommodates at least a portion of the adhesive layer 260. The trench Tr of the interposer 60a includes a groove in a bottom surface of the interposer substrate 610a that is concavely formed in a direction that faces the top surface of the interposer substrate 610a.

In an exemplary embodiment, a cross-section in a horizontal direction of the trench Tr of the interposer 60a has a square or round shape. However, the shape of the cross-section in the horizontal direction of the trench Tr of the interposer 60a is not limited to the shapes disclosed above.

In addition, a depth tr_d in a vertical direction of the trench Tr of the interposer 60a ranges from about 5 micrometers to about 100 micrometers. In addition, a depth in the vertical direction of the trench Tr of the interposer 60a is less than the length in the vertical direction of the adhesive layer 260. For example, the vertical depth Tr_d of the trench Tr of the interposer ranges from about 5% to about 20% of the vertical length of the adhesive layer 260.

As the interposer 60a has the trench Tr formed in the bottom portion thereof, the interposer substrate 610a of the interposer 60a surrounds at least a portion of the adhesive layer 260. In addition, the vertical length of the adhesive layer 260 in the trench Tr is greater than the vertical length of the molding layer 410.

As the interposer 60a has the trench Tr that accommodates at least a portion of the adhesive layer 260, a gap in the vertical direction between the interposer 60a and the semiconductor chip 100 increases, and a thickness of the adhesive layer 260 that fills the gap increases. Due to the increased thickness of the adhesive layer 260 between the interposer 60a and the semiconductor chip 100, the structural reliability between the interposer 60a and the semiconductor chip 100 is increased.

In addition, since inner surfaces of the interposer substrate 610a that surround the trench Tr of the interposer 60a support a portion of the side of the adhesive layer 260, the structural reliability of the adhesive layer 260 is increased.

Figure 10:
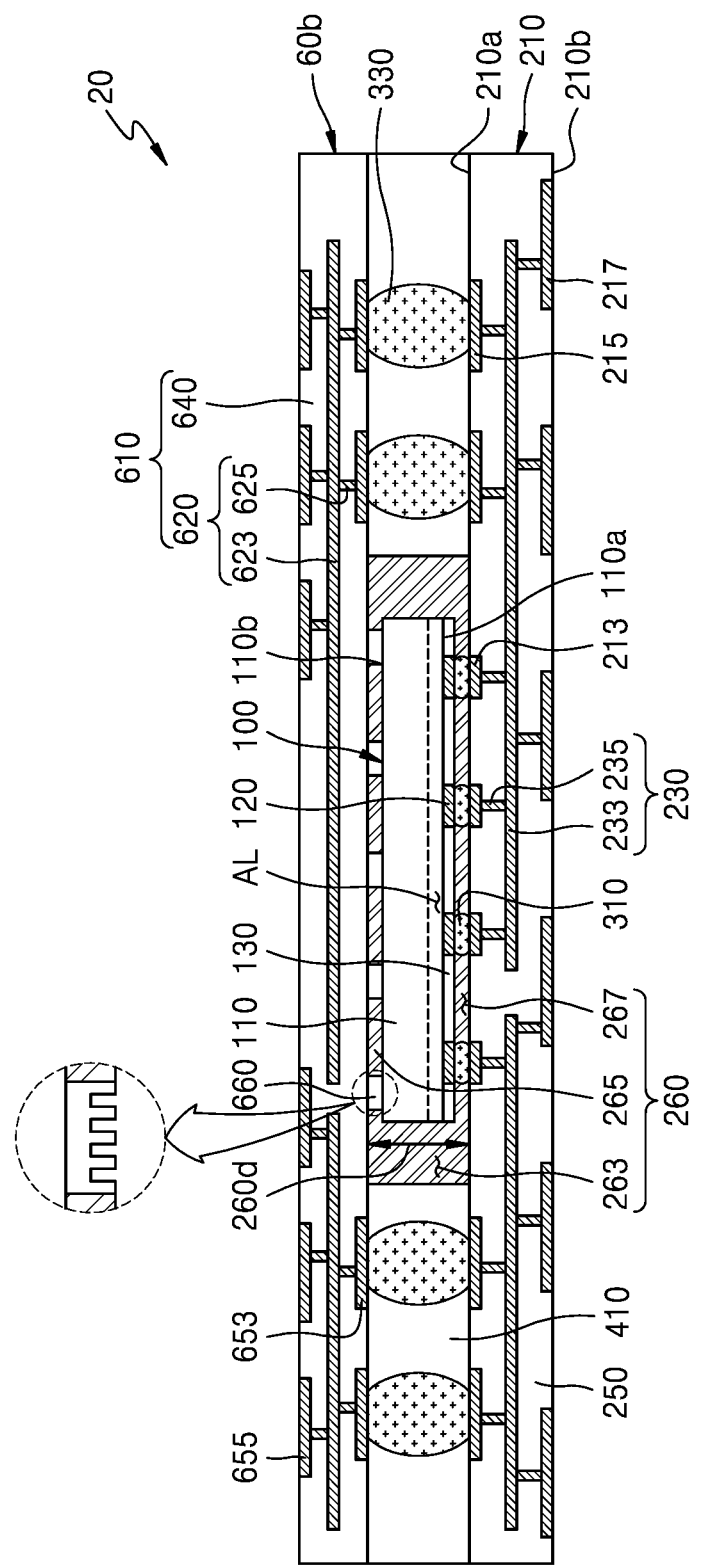
FIG. 10 is a cross-sectional view of a semiconductor package according to an exemplary embodiment of the inventive concept.

FIG. 10 is a cross-sectional view of a semiconductor package 20 according to an exemplary embodiment of the inventive concept.

Hereinafter, repeated descriptions regarding the semiconductor package 10 of FIG. 1 will be omitted, and differences therebetween will be mainly described.

Referring to FIG. 10, in an embodiment, an interposer 60b of the semiconductor package 20 includes the interposer substrate 610, the first interposer substrate pad 653, the second interposer substrate pad 655, and an interposer patch 660.

The interposer patch 660 protrudes from the bottom surface of the interposer substrate 610. In addition, the interposer patch 660 is located between the bottom surface of the interposer substrate 610 and the top surface of the semiconductor chip 100. For example, in a process of mounting the interposer 60b on the package substrate 210, the interposer patch 660 comes in contact with the top surface of the semiconductor chip 100.

In an exemplary embodiment, the interposer patch 660 has a concavo-convex shape of which concavity and convexity repeatedly appear. In addition, a material of the interposer patch 660 is substantially identical to the material of the interposer insulating layer 640. For example, the material of the interposer patch 660 includes an oxide or a nitride.

In an exemplary embodiment, in the process of mounting the interposer 60b on the package substrate 210, the interposer patch 660 functions as a damper that reduces an intensity of a physical contact between the semiconductor chip 100 and the interposer 60b. In addition, in the process of mounting the interposer 60b on the package substrate 210, the interposer patch 660 can prevent inclination of the interposer 60b.

In an exemplary embodiment, a plurality of the interposer patches 660 are provided, and the plurality of interposer patches 660 are spaced apart in the horizontal direction. A portion of the adhesive layer 260 is interposed between the semiconductor chip 100 and the interposer 60b and surrounds the interposer patch 660.

Figure 11:
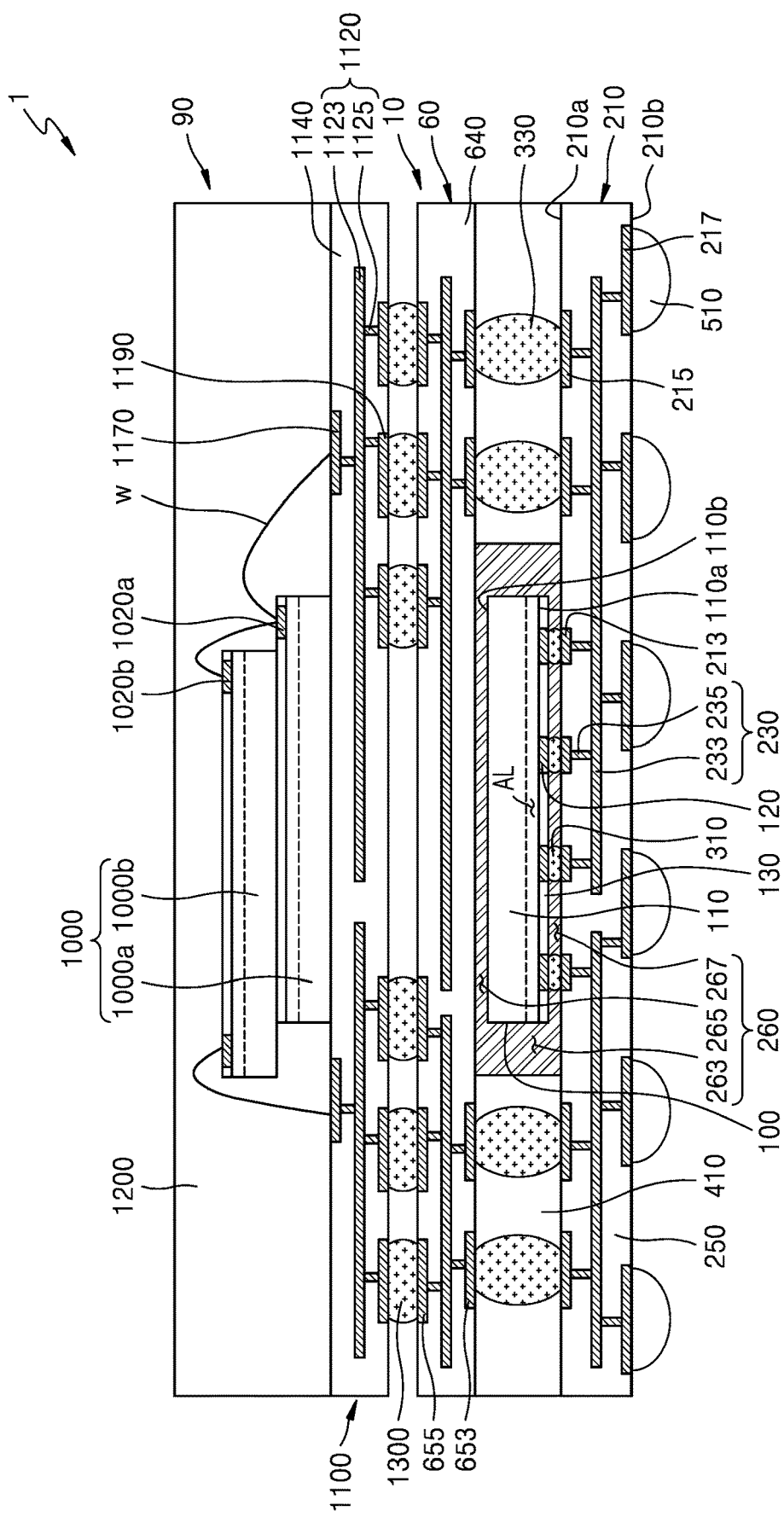
FIG. 11 is a cross-sectional view of a semiconductor package according to an exemplary embodiment of the inventive concept.

FIG. 11 is a cross-sectional view of a semiconductor package 1 according to an exemplary embodiment of the inventive concept.

The semiconductor package 1 of FIG. 11 is a package-on-package (PoP) type semiconductor package that includes a lower semiconductor package 10 and an upper semiconductor package 90. In detail, the semiconductor package 1 has a structure in which the upper semiconductor package 90 is mounted on the semiconductor package 10 described with reference to FIG. 1.

The lower semiconductor package 10 includes the package substrate 210, the lower semiconductor chip 100, the adhesive layer 260, the chip connection terminal 310, the conductive pillar 330, the lower molding layer 410, an external connection terminal 510, the interposer 60, etc. The inventive concept regarding the lower semiconductor package 10 is the same as that described with reference to FIG. 1, and therefore, details thereof are omitted.

In an embodiment, the external connection terminal 510 includes a terminal connected to the third package substrate pad 217 of the package substrate 210 and that is configured to connect the package substrate 210 to an external device. The external connection terminal 510 includes a metal such as at least one of Ag, Cu, or Al.

The semiconductor package 1 of FIG. 11 includes technical idea of the lower semiconductor package 10 described with reference to FIG. 1. However, embodiments of the semiconductor package 1 are not limited thereto and other embodiments include technical ideas regarding lower semiconductor packages as described with reference to FIGS. 4 to 10.

The upper semiconductor package 90 includes an upper semiconductor chip 1000, a redistribution structure 1100, an upper molding layer 1200, a package connection terminal 1300, etc.

In an exemplary embodiment, the upper semiconductor chip 1000 is mounted on the redistribution structure 1100. A plurality of the upper semiconductor chips 1000 may be provided. For example, the upper semiconductor chip 1000 includes a first upper semiconductor chip 1000a and a second upper semiconductor chip 1000b disposed on the first semiconductor chip 1000a.

In an exemplary embodiment, the second upper semiconductor chip 1000b is mounted on a top surface of the first upper semiconductor chip 1000a. For example, the second upper semiconductor chip 1000b is attached onto the top surface of the first semiconductor chip 1000a through an adhesive material such as an adhesive film.

In addition, the first upper semiconductor chip 1000a and the second upper semiconductor chip 1000b are electrically connected to each other through a conductive wire w. However, the electrical connections of the first upper semiconductor chip 1000a and the second upper semiconductor chip 1000b are not limited thereto, and in other embodiments, the first and second upper semiconductor chips 1000a and 1000b are electrically connected to each other through a penetration electrode.

In an exemplary embodiment, the first upper semiconductor chip 1000a and the second upper semiconductor chip 1000b each includes a logic semiconductor chip. The logic semiconductor chip is at least one of, for example, a logic semiconductor chip such as central processor unit (CPU), a micro processor unit (MPU), a graphic processor unit (GPU), or an application processor (AP).

In addition, the first upper semiconductor chip 1000a and the second upper semiconductor chip 1000b each includes a memory semiconductor chip. The memory semiconductor chip is at least one of, for example, a volatile memory semiconductor chip such as a dynamic random access memory (DRAM) or a static random access memory (SRAM), and may also include a non-volatile memory semiconductor chip such as a phase-change random access memory (PRAM), a magneto-resistive random access memory (MRAM), a ferroelectric random access memory (FeRAM), or a resistive random access memory (RRAM).

The redistribution structure 1100 includes a redistribution pattern 1120, a redistribution insulating layer 1140, a first redistribution pad 1170, a second redistribution pad 1190, etc. In an exemplary embodiment, the redistribution pattern 1120 includes a redistribution line pattern 1123 that extends in a first or horizontal direction in the redistribution insulating layer 1140 and a redistribution via pattern 1125 that extends in a second or vertical direction in the redistribution insulating layer 1140.

In an exemplary embodiment, a material of the redistribution pattern 1120 includes Cu. However, the material of the redistribution pattern 1120 is not limited thereto and may include a metal such as Ni, Au, Ag, Al, W, Ti, Ta, In, Mo, Mn, Co, Sn, Mg, Re, Be, Ga, or Ru, or an alloy thereof.

The redistribution insulating layer 1140 surrounds the redistribution pattern 1120. In an exemplary embodiment, the material of the redistribution insulating layer 1140 includes an oxide or a nitride. For example, the redistribution insulating layer 1140 includes silicon oxide or silicon nitride.

In an exemplary embodiment, the first redistribution pad 1170 is disposed on a top surface of the redistribution structure 1100 and electrically connects the first upper semiconductor chip 1000a and the second upper semiconductor chip 1000b to the redistribution patter 1120.

In an exemplary embodiment, the first upper semiconductor chip 1000a and the second upper semiconductor chip 1000b are connected to the redistribution structure 1100 through the conductive wire w. In further detail, the conductive wire w connects a chip pad 1020a of the first upper semiconductor chip 1000a to the first redistribution pad 1170 of the redistribution structure 1100, and connects a chip pad 1020b of the second upper semiconductor chip 1000b to the chip pad 1020a of the first upper semiconductor chip 1000a, thereby connecting the chip pad 1020b of the second upper semiconductor chip 1000b to first redistribution pad 1170 of the redistribution structure 1100.

In an exemplary embodiment, the second redistribution pad 1190 is disposed on a bottom surface of the redistribution structure 1100, and is the pad on which the package connection terminal 1300 is mounted.

In an exemplary embodiment, the upper molding layer 1200 surrounds the upper semiconductor chip 1000 on the redistribution structure 1100. The upper molding layer 1200 includes an underfill material that includes at least one of an insulating polymer or an epoxy resin. For example, the upper molding layer 1200 includes an epoxy molding compound (EMC).

In an exemplary embodiment, a side of the upper molding layer 1200 of the upper semiconductor package 90 is coplanar with a side of the redistribution structure 1100. In addition, a side of the upper semiconductor package 90 is coplanar with a side of the lower semiconductor package 10.

In an exemplary embodiment, the package connection terminal 1300 includes a connection terminal interposed between the interposer 60 and the redistribution structure 1100 and that electrically connects the upper semiconductor chip 1000 to the interposer 60. For example, the package connection terminal 1300 includes a solder ball made of a metal such as at least one of Sn, Ag, Cu, or Al.

In an exemplary embodiment, the package connection terminal 1300 electrically connects the second redistribution pad 1190 of the redistribution structure 1100 to the second interposer substrate pad 655 of the interposer 60.

The semiconductor package 1 according to an exemplary embodiment includes the adhesive layer 260 that includes the first adhesive portion 263 interposed between a lower semiconductor chip 100 and the package substrate 210 and that adheres the lower semiconductor chip 100 and the package substrate 210 to each other, the second adhesive portion 265a disposed adjacent to the sides of the semiconductor chip 100, and the third adhesive portion 267 interposed between the lower semiconductor chip 100 and the interposer substrate 610 and that adheres the lower semiconductor chip 100 and the interposer substrate 610 to each other.

In addition, the adhesive layer 260 includes a material that softens but does not completely dissolve or melt when heat is applied thereto. Therefore, in a process of forming the adhesive layer 260 on the package substrate 210, a space between the lower semiconductor chip 100 and the package substrate 210 and a space between the lower semiconductor chip 100 and the interposer substrate 610 is filled with the adhesive layer 260, without voids.

Accordingly, the structural reliability between the lower semiconductor chip 100 and the package substrate 210 and the structural reliability between the lower semiconductor chip 100 and the interposer substrate 610 is increased.

Hereinafter, a method of manufacturing a semiconductor package according to an exemplary embodiment of the inventive concept will be described in detail with reference to FIGS. 12 to 18. The manufacturing method of the semiconductor package of the inventive concept includes a manufacturing method of the PoP type semiconductor package 1 described with reference to FIG. 11.

Figure 12:
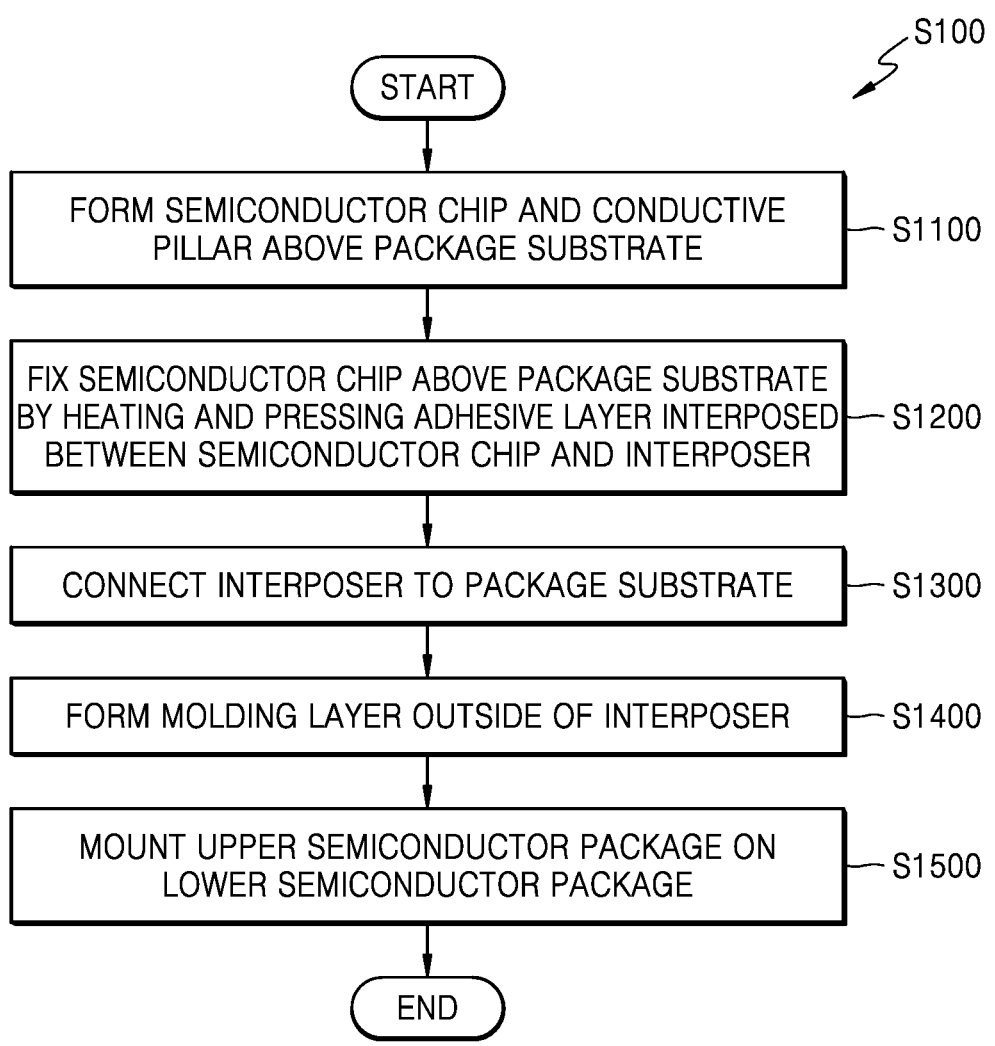
FIG. 12 is a flowchart of a method of manufacturing a semiconductor package according to an exemplary embodiment of the inventive concept.

FIG. 12 is a flowchart of a manufacturing method (S100) of the semiconductor package 1 according to an exemplary embodiment of the inventive concept. FIG. 13 through FIG. 18 illustrate processes of the manufacturing method (S100) of the semiconductor package 1 according to an exemplary embodiment of the inventive concept.

Referring to FIG. 12, a manufacturing method of the semiconductor package 1 (S100) according to an exemplary embodiment of the inventive concept includes: forming the semiconductor chip 100 and the conductive pillar 330 on the package substrate 210 (S1100); heating and pressing the adhesive layer 260 interposed between the semiconductor chip 100 and the interposer 60 and fixing the semiconductor chip 100 above the package substrate 210 through the adhesive layer 260 (S1200); connecting the interposer 60 to the package substrate 210 (S1300); forming the molding layer 410 outside of the adhesive layer 260 (S1400); and mounting the upper semiconductor package 90 onto the lower semiconductor package 10 (S1500).

Figure 13:
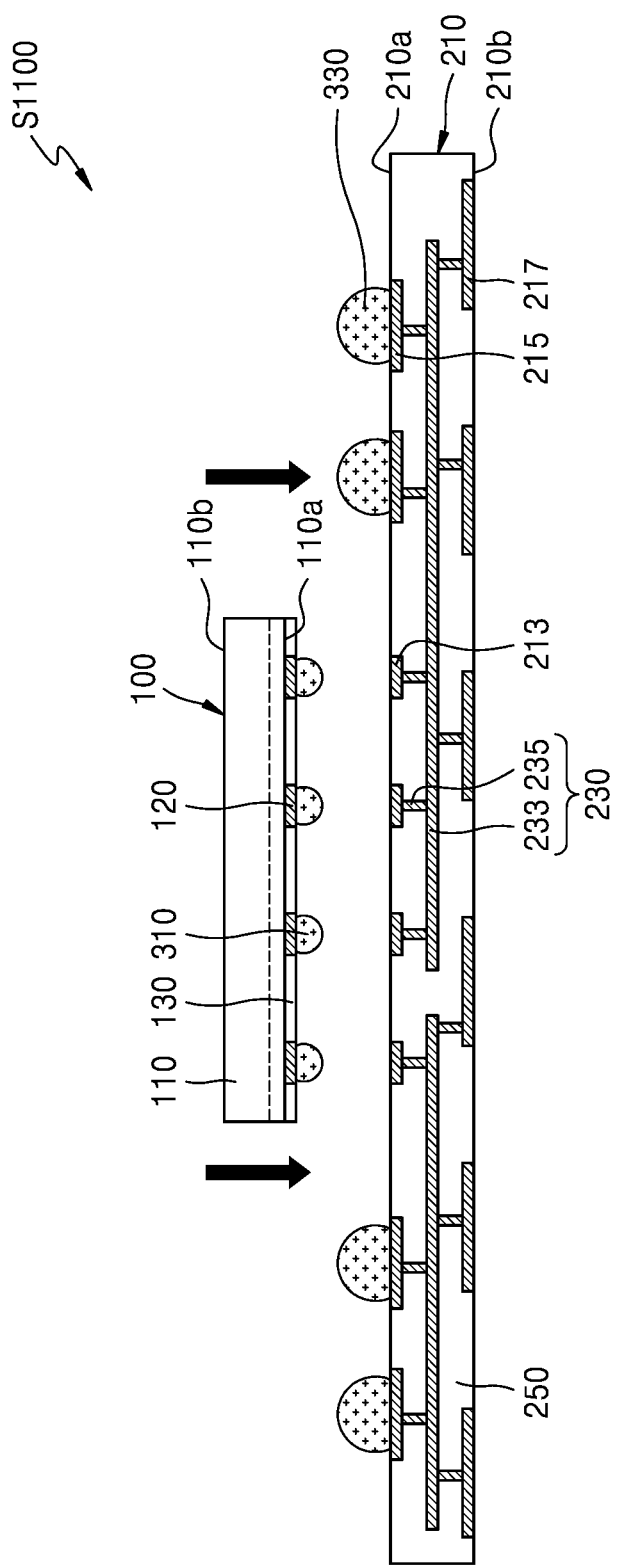
FIG. 13 through FIG. 18 illustrate processes of a method of manufacturing a semiconductor package according to an exemplary embodiment of the inventive concept.

FIG. 13 illustrates a process of forming the semiconductor chip 100 and the conductive pillar 330 on the package substrate 210.

Referring to FIGS. 12 and 13, in an embodiment, the manufacturing method (S100) of the semiconductor package 1 according to an exemplary embodiment of the inventive concept includes forming the semiconductor chip 100 and the conductive pillar 330 on the package substrate 210 (S1100).

Operation S1100 includes: mounting the semiconductor chip 100 in a center portion of the semiconductor chip 100; and forming the conductive pillar 330 at an edge portion of the package substrate 210.

Mounting the semiconductor chip 100 on the package substrate 210 includes electrically connecting the semiconductor chip 100 to the package substrate 210 through a flip-chip bonding process. In detail, the semiconductor chip 100 is mounted on the package substrate 210 such that the chip connection terminal 310 attached to the bonding surface of the chip pad 120 of the semiconductor chip 100 contacts the first package substrate pad 213 of the package substrate 210.

In addition, forming the conductive pillar 330 on the package substrate 210 includes mounting the conductive pillar 330 on the package substrate 210 such that a bottom surface of the conductive pillar 330 contacts the second package substrate pad 215 of the package substrate 210.

FIGS. 14A to 14D and 15 illustrate operation S1200 of heating and pressing the adhesive layer 260 interposed between the semiconductor chip 100 and the interposer 60 and fixing the semiconductor chip 100 onto the package substrate 210 through the adhesive layer 260, according to embodiments of the disclosure.

Figure 14A:
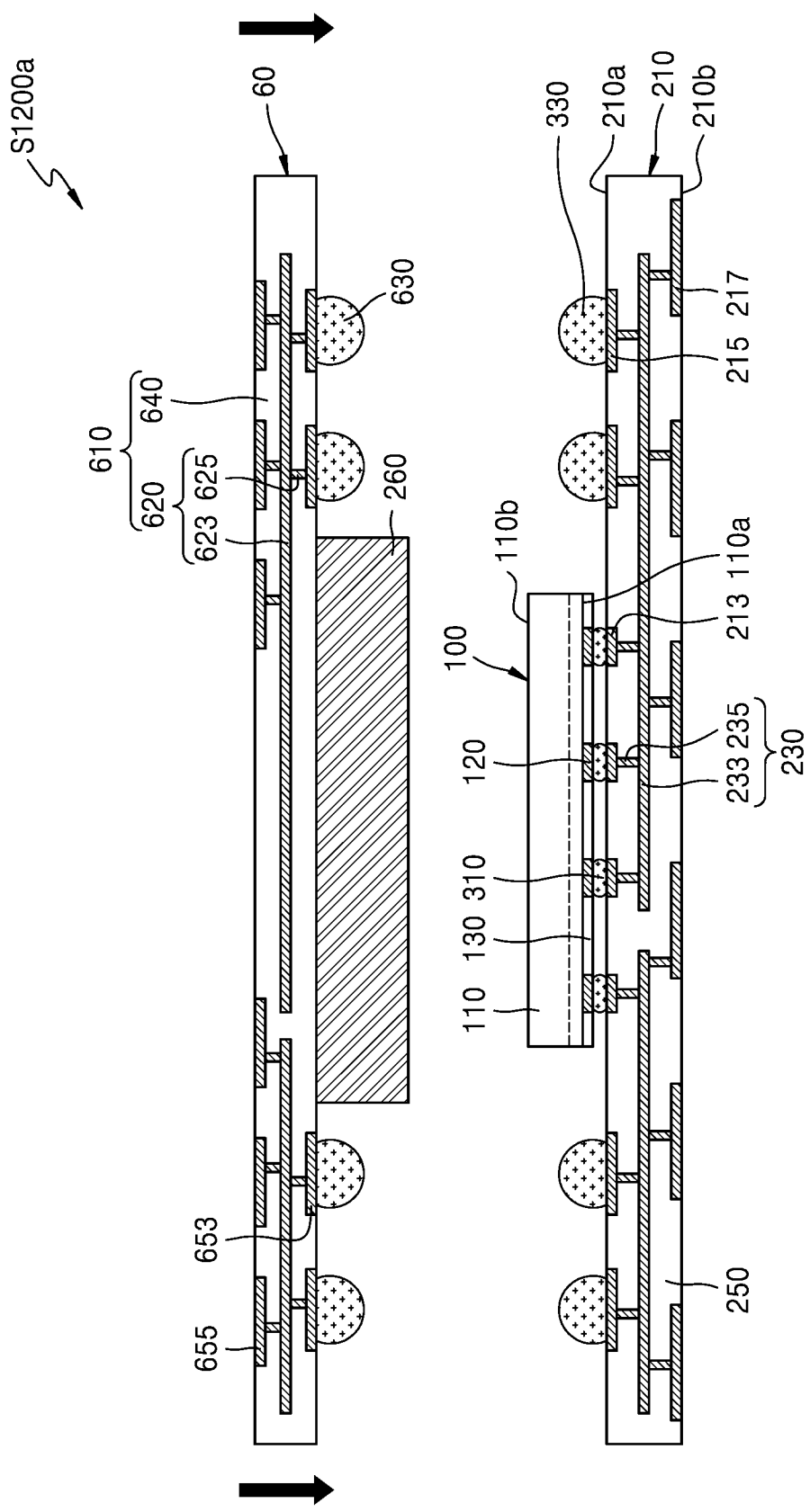

Referring to FIG. 14A, in an embodiment, operation S1200a includes attaching the adhesive layer 260 to a bottom portion of the interposer substrate 610. For example, the adhesive layer 260 is attached to a portion of the bottom surface of the interposer substrate 610 that overlaps the semiconductor chip 100 in the vertical direction, but does not overlap the conductive pillar 330. In addition, a horizontal length of the adhesive layer 260 attached to the interposer substrate 610 is greater than a horizontal length of the semiconductor chip 100.

In an exemplary embodiment, the adhesive layer 260 includes a material that softens but does not completely dissolve or melt when heat is applied thereto. In addition, the adhesive layer 260 includes a DAF that softens but does not completely dissolve or melt when heat is applied thereto. When the adhesive layer 260 includes a DAF, the adhesive layer 260 can be attached to the bottom surface of the interposer substrate 610 by taping.

When the interposer substrate 610 moves downward to heat and press the adhesive layer 260 between the interposer substrate 610 and the semiconductor chip 100, the adhesive layer 260 softens but does not completely dissolve or melt.

Accordingly, the adhesive layer 260 flows in a direction toward the package substrate 210. In addition, the adhesive layer 260 flows into and fills the space between the package substrate 210 and the semiconductor chip 100 and surrounds the chip connection terminal 310. The adhesive layer 260 is shaped in the space between the semiconductor chip 100 and the package substrate 210 according to fluidity of the adhesive layer 260.

Due to the fluidity of the adhesive layer 260, like the adhesive layer 260a described with reference to FIG. 4, the adhesive layer 260 can be formed to have a tapered shape of which a horizontal cross-sectional area decreases away from the package substrate 210. However, embodiments are not limited thereto, and when the fluidity of the adhesive layer 260 is relatively low, like the adhesive layer 260 described with reference to FIG. 1, the side of the adhesive layer 260 is perpendicular to the extension direction of the top surface 210a of the package substrate 210.

Figure 14B:
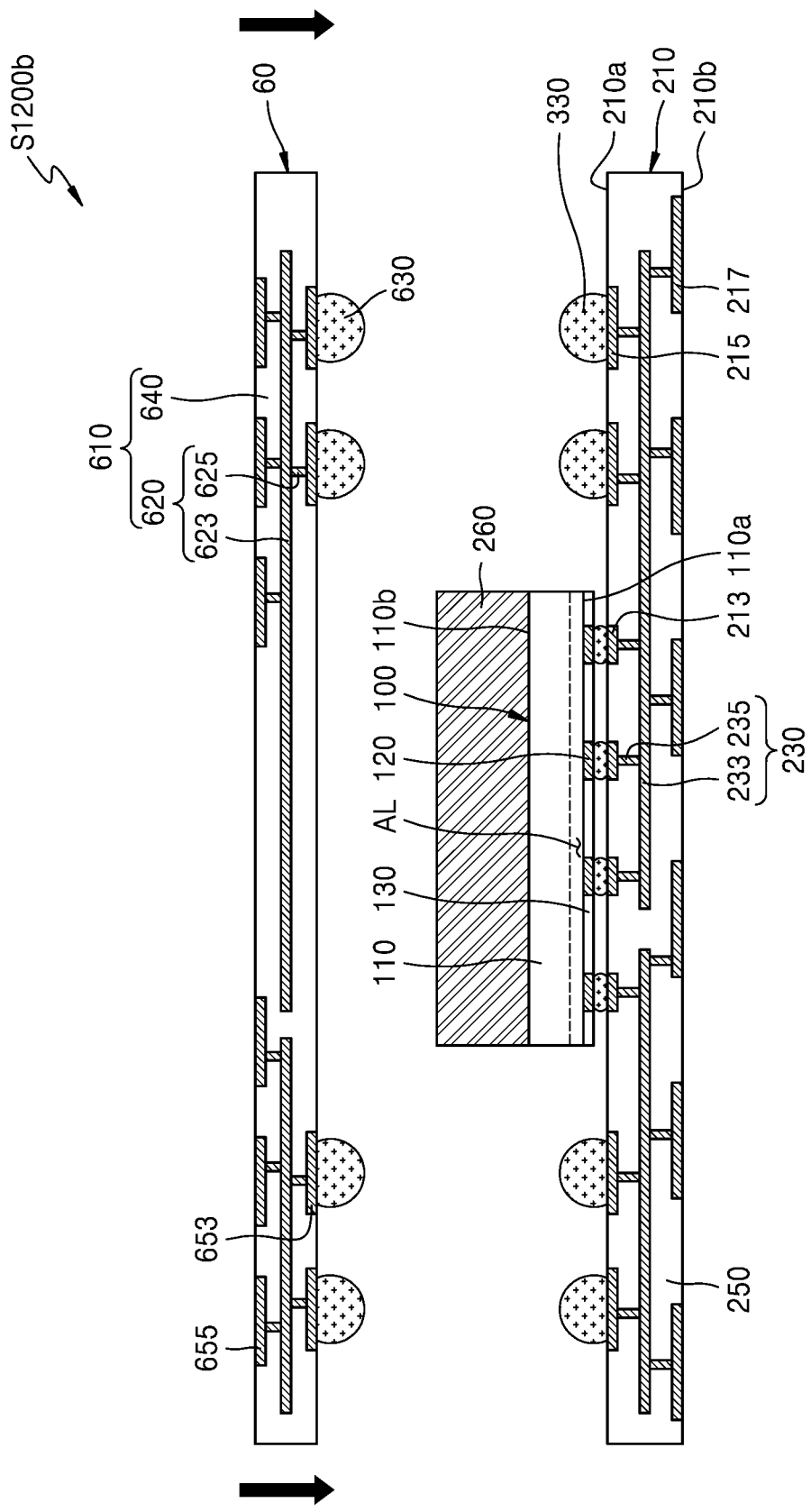

Referring to FIG. 14B, in an embodiment, operation S1200b includes attaching the adhesive layer 260 to the top surface of the semiconductor chip 100. The vertical length of the adhesive layer 260 attached to the top surface of the semiconductor chip 100 is greater than a vertical length of the semiconductor chip 100. In addition, the horizontal length of the adhesive layer 260 is substantially equal to the horizontal length of the semiconductor chip 100. That is, the side of the adhesive layer 260 is coplanar with the side of the semiconductor chip 100.

When the interposer substrate 610 moves downward to heat and press the adhesive layer 260 between the interposer substrate 610 and the semiconductor chip 100, the adhesive layer 260 softens but does not completely dissolve or melt.

When the adhesive layer 260 is pressed by the interposer substrate 610, the adhesive layer 260 expands from the space between the semiconductor chip 100 and the interposer substrate 610 to the outside of the semiconductor chip 100. In addition, a portion of the adhesive layer 260 flows in a direction toward the package substrate 210 and fills the space between the package substrate 210 and the semiconductor chip 100. In this case, like the adhesive layer 260b (see FIG. 5) described with reference to FIG. 5, the adhesive layer 260 is formed in a tapered shape of which a cross-sectional area in the horizontal direction increases away from the package substrate 210.

Figure 14C:
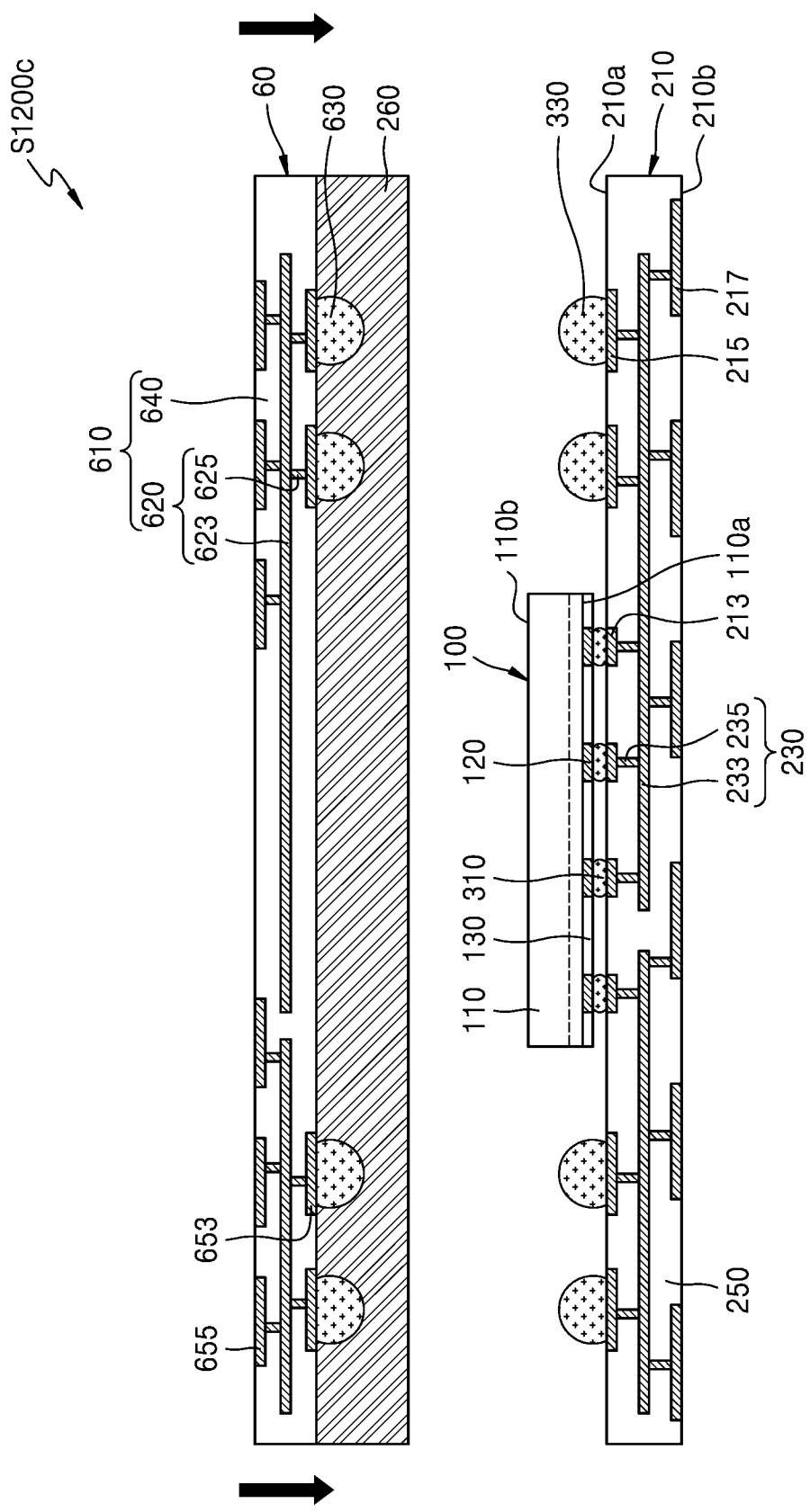

Referring to FIG. 14C, in an embodiment, operation S1200c includes attaching the adhesive layer 260 to the bottom portion of the interposer substrate 610. For example, the adhesive layer 260 is attached to the bottom surface of the interposer substrate 610 to overlap the semiconductor chip 100 and the conductive pillar 330 in the vertical direction.

In addition, the vertical length of the adhesive layer 260 attached to the interposer substrate 610 is greater than the vertical length of the semiconductor chip 100, and the horizontal length of the adhesive layer 260 is substantially equal to the horizontal length of the semiconductor chip 100. For example, the side of the adhesive layer 260 is coplanar with the side of the interposer substrate 610.

When the interposer substrate 610 moves downward to heat and press the adhesive layer 260 between the interposer substrate 610 and the semiconductor chip 100, the adhesive layer 260 fills the space between the package substrate 210 and the semiconductor chip 100, thereby surrounding the chip connection terminal 310 and the conductive pillar 330 outside of the semiconductor chip 100.

The adhesive layer 260 of a semiconductor package manufactured according to a manufacturing method shown in FIG. 14C cover the conductive pillar 330 outside of the semiconductor chip 100, like the adhesive layer 260 (see FIG. 7) shown in FIG. 7.

Figure 14D:
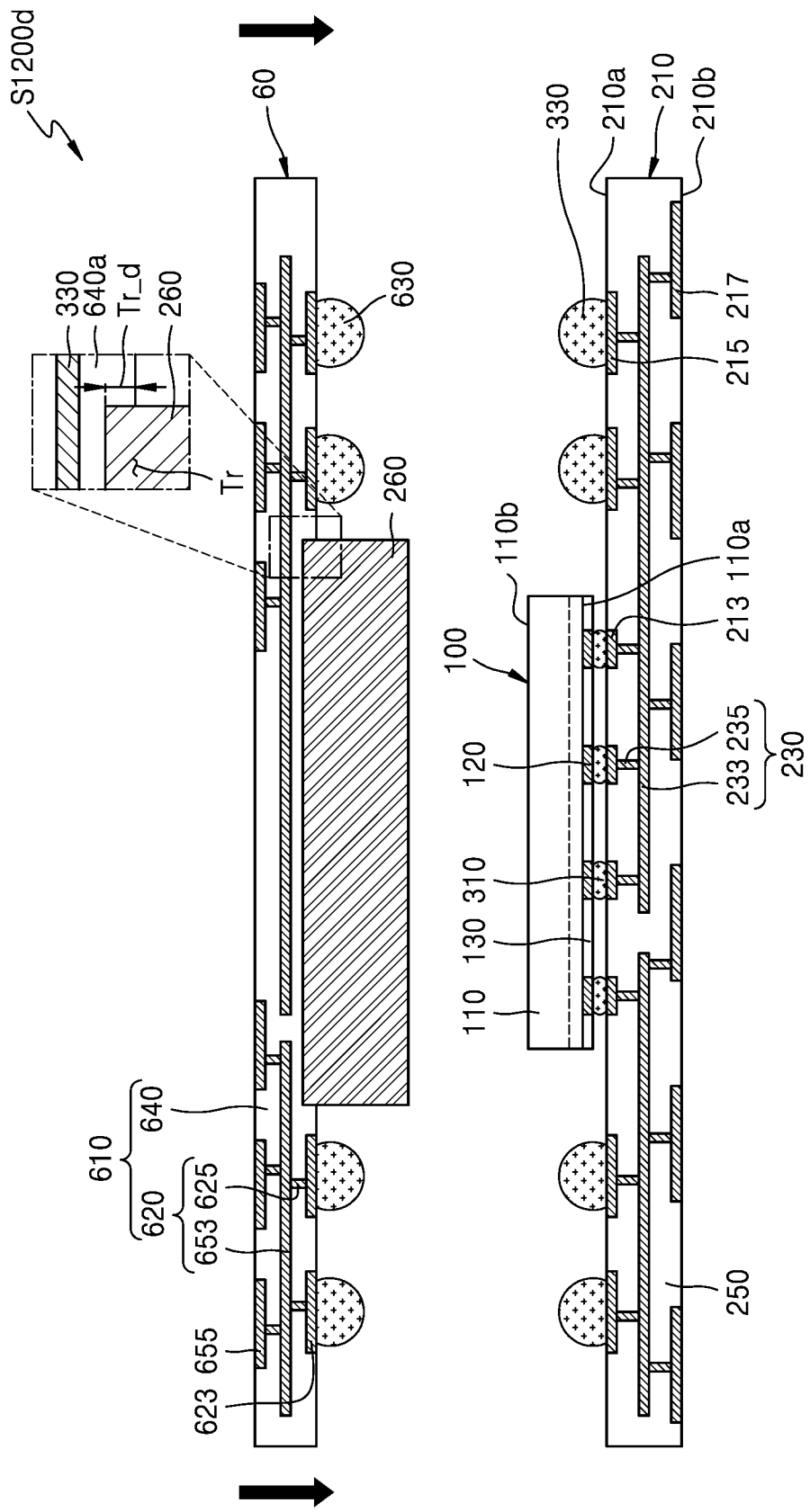

Referring to FIG. 14D, in an embodiment, operation S1200d includes attaching the adhesive layer 260 to a bottom portion of an interposer substrate 610. For example, a portion of the adhesive layer 260 is accommodated in the trench Tr formed in the bottom portion of the interposer substrate 610. For example, the adhesive layer 260 is attached to inner surfaces of the trench Tr formed in the interposer 610.

As the interposer 60 includes the trench Tr that accommodates at least a portion of the adhesive layer 260, a vertical gap between the interposer 60 and the semiconductor chip 100 increases, and the thickness of the adhesive layer 260 filling the gap also increases. Due to the increased thickness of the adhesive layer 260 between the interposer 60 and the semiconductor chip 100, the structural reliability between the interposer 60 and the semiconductor chip 100 is increased.

In addition, as the inner surfaces of the trench Tr formed in the interposer 60 support the adhesive layer 260 in the trench Tr, escape of the adhesive layer 260 can be prevented.

Figure 15:
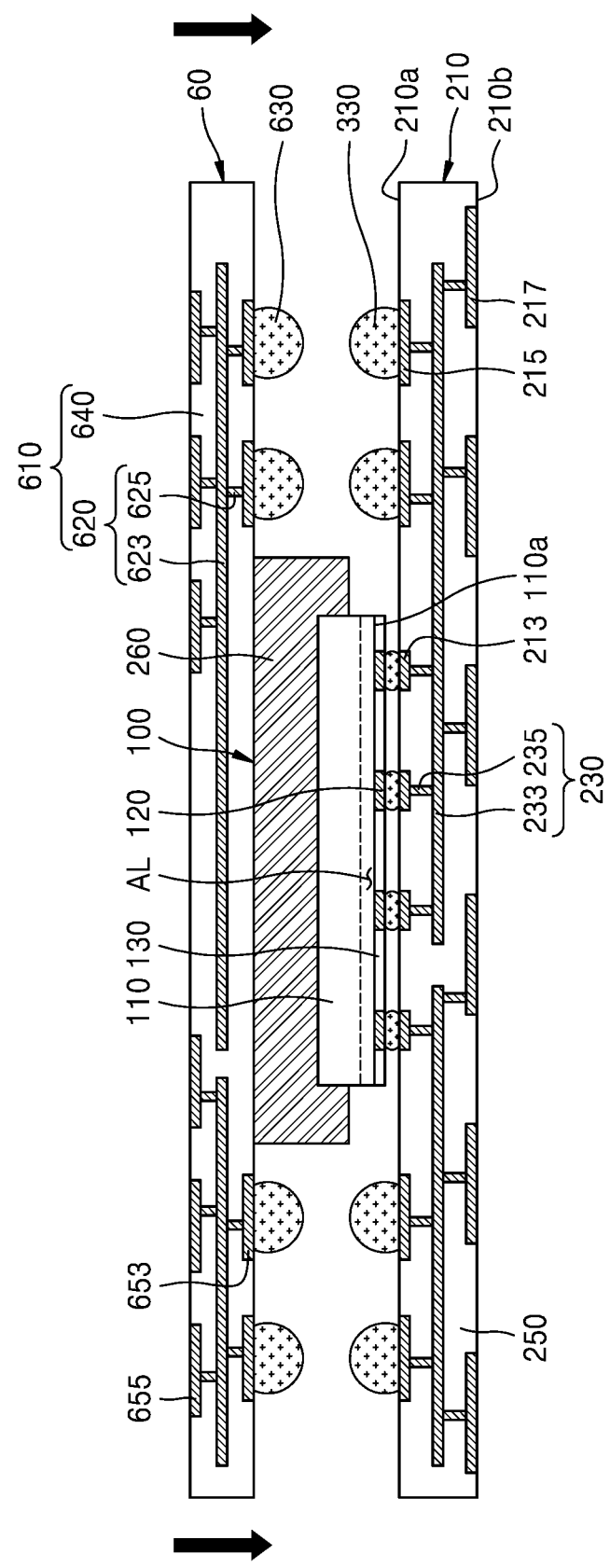

Referring to FIG. 15, in an embodiment, when the interposer 60 moves downward, the adhesive layer 260 between the semiconductor chip 100 and the interposer 60 is pressed and heated. When the adhesive layer 260 is heated, the adhesive layer 260 softens but does not being completely dissolve or melt.

In a process in which the interposer 60 presses the adhesive layer 260, the adhesive layer 260 fills a space between the interposer 60 and the semiconductor chip 100. In addition, when the interposer 60 continually moves downward, the adhesive layer 260 flows in the direction toward the package substrate 210, and fills the space between the package substrate 210 and the semiconductor chip 100.

Figure 16:
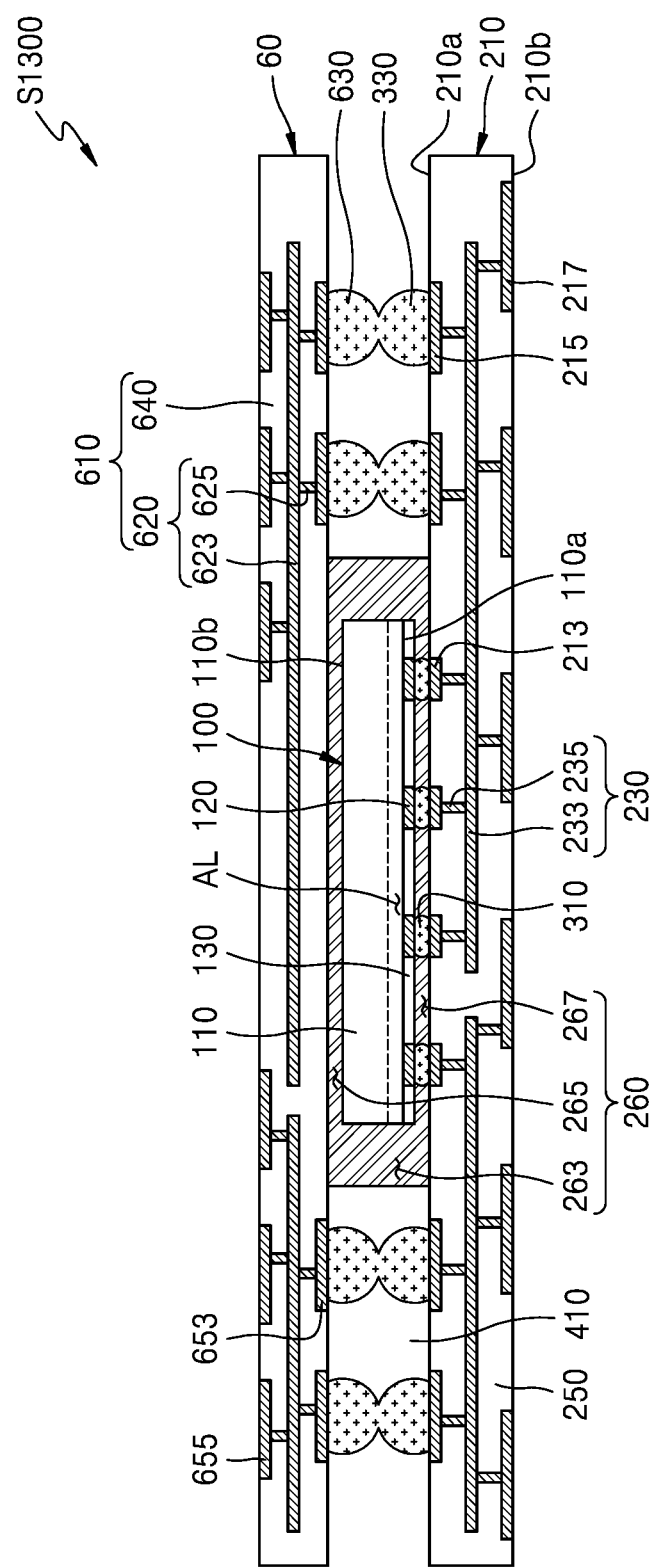

FIG. 16 illustrates operation S1300 that connects the interposer 60 to the package substrate 210.

Referring to FIG. 16, in an embodiment. operation S1300 includes connecting the interposer connection terminal 630 of the interposer 60 to the conductive pillar 330 mounted on the package substrate 210. In operation S1300, the interposer connection terminal 630 and the conductive pillar 330 become integrated. Accordingly, the interposer 60 and the package substrate 210 are electrically connected to each other through the conductive pillar 330.

Figure 17:
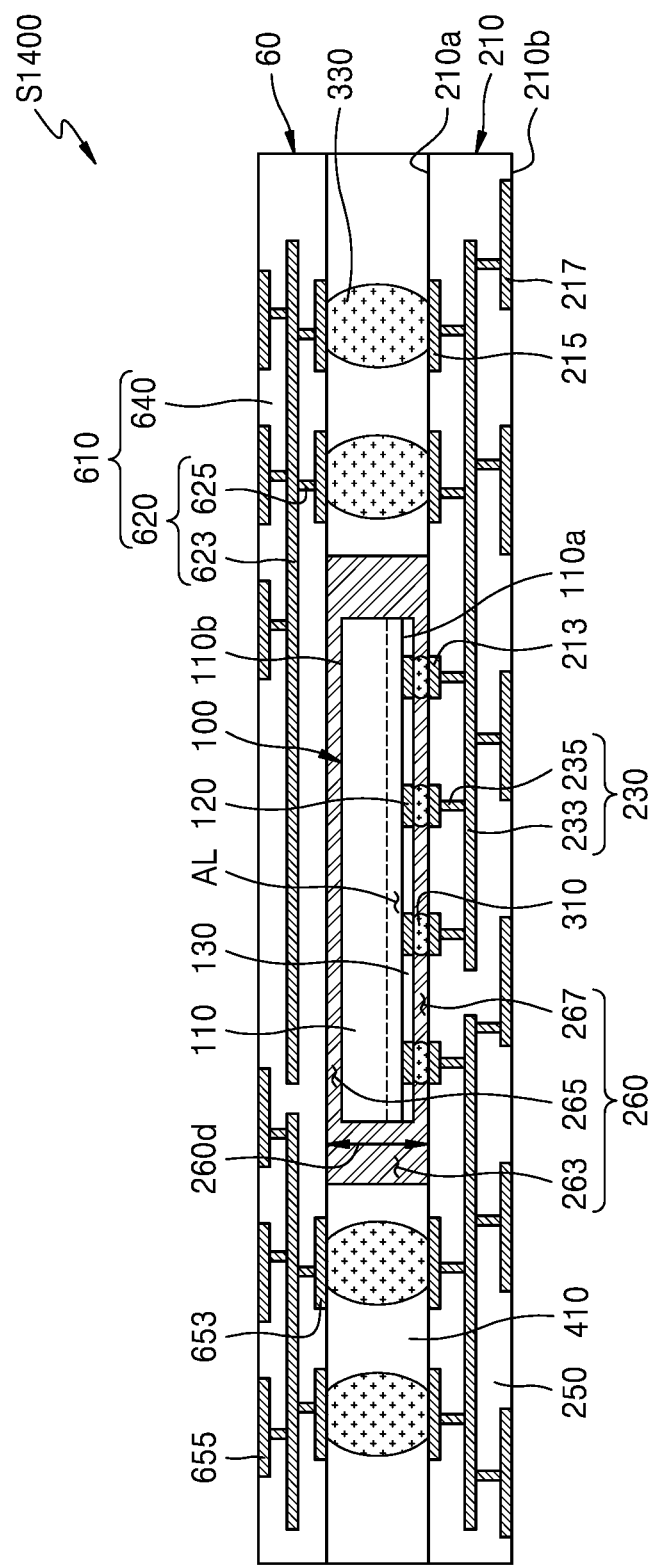

FIG. 17 illustrates operation S1400 that forms the molding layer 410 outside of the adhesive layer 260.

Referring to FIG. 17, in an embodiment, operation S1400 includes injecting the molding layer 410 into the space between the package substrate 210 and the interposer 60. The molding layer 410 injected between the package substrate 210 and the interposer 60 surrounds the sides of the adhesive layer 260. In addition, the molding layer 410 fixes the interposer 60 above the package substrate 210.

Manufacturing the semiconductor package 10 described with reference to FIG. 1 is completed through operations of a manufacturing method of a semiconductor package shown in FIGS. 13 to 17. The semiconductor package 10 functions as a lower semiconductor package in a PoP type semiconductor package that includes a lower semiconductor package and an upper semiconductor package.

Figure 18:
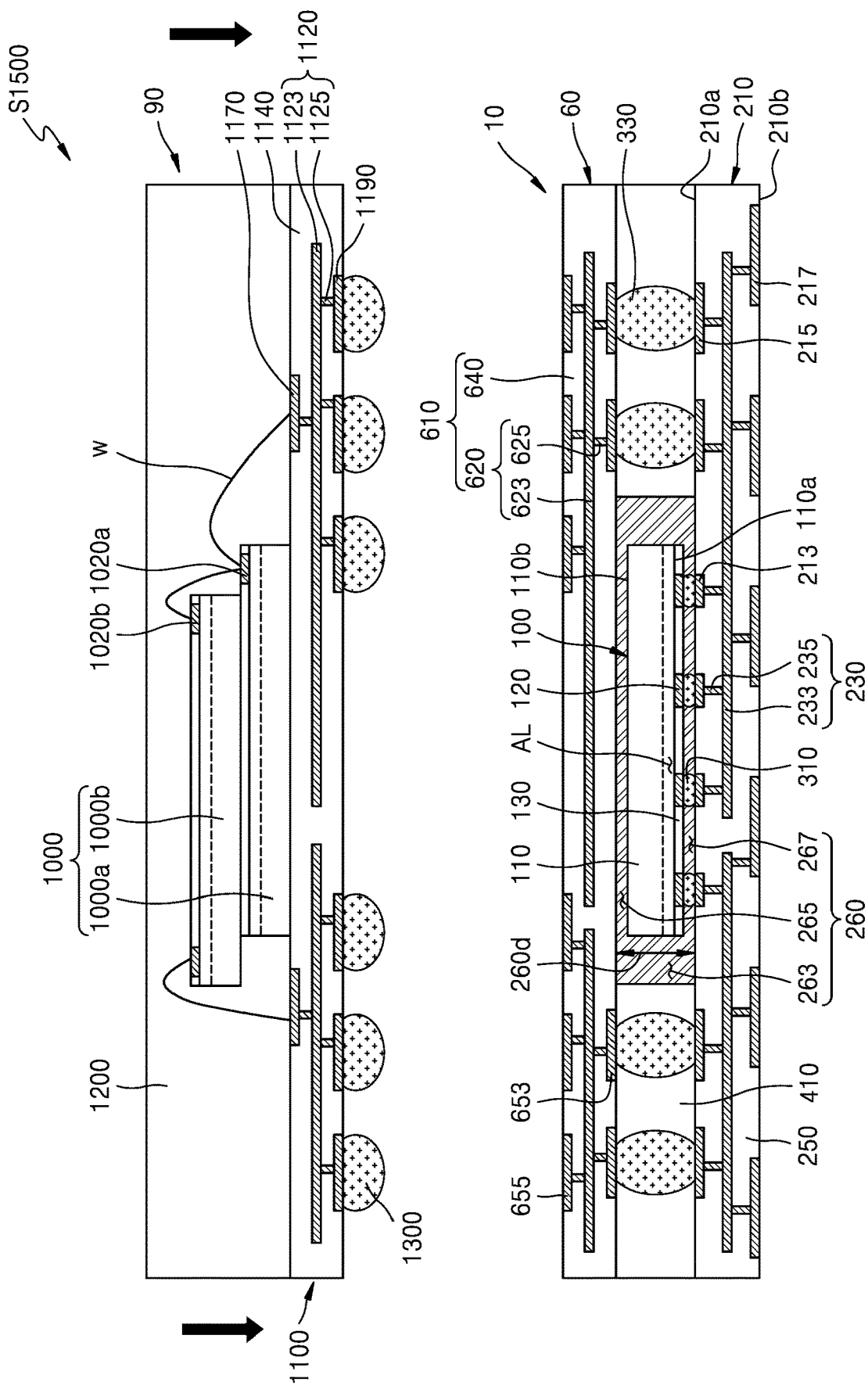

FIG. 18 illustrates operation S1500 that mounts the upper semiconductor package 90 onto the interposer 60 of the lower semiconductor package 10.

Referring to FIG. 18, in an embodiment, operation S1500 includes mounting the upper semiconductor package 90 above the interposer 60 such that the package connection terminal 1300 contacts the second interposer substrate pad 655 of the interposer 60.

As the manufacturing method S100 of the semiconductor package 1 according to an exemplary embodiment of the inventive concept includes heating and pressing the adhesive layer 260, the space between the semiconductor chip 100 and the package substrate 210 and the space between the semiconductor chip 100 and the interposer substrate 610 is filled with the adhesive layer 260 without voids.

Accordingly, the structural reliability between the semiconductor chip 100 and the package substrate 210 of the semiconductor package 1 according to an exemplary embodiment of the inventive concept and the structural reliability between the semiconductor chip 100 and the interposer substrate 610 is increased.

In addition, a manufacturing method of the semiconductor package 1 according to an exemplary embodiment of the inventive concept fixes both the semiconductor chip 100 and the package substrate 210 to each other and the semiconductor chip 100 and the interposer 60 to each other through one adhesive layer 260.

Accordingly, using the manufacturing method S100 of the semiconductor package 1 according to an exemplary embodiment shortens a manufacturing duration and reduces a manufacturing cost of the semiconductor package. In addition, the semiconductor package 1 manufactured by the manufacturing method S100 of the semiconductor package 1 is thinner and lighter.

While embodiments of the inventive concept have been particularly shown and described with reference to the drawings, it will be understood that various changes in form and details may be made therein without departing from the spirit and scope of the following claims.

What is claimed is:

1. A semiconductor package, comprising:
a package substrate;
a semiconductor chip mounted above the package substrate;
a chip connection terminal interposed between the semiconductor chip and the package substrate and that connects the semiconductor chip to the package substrate;
an adhesive layer disposed on the package substrate, wherein the adhesive layer covers a side and a top surface of the semiconductor chip and surrounds the chip connection terminal between the semiconductor chip and the package substrate;
a molding layer disposed on the package substrate and that surrounds the adhesive layer, wherein a material of the molding layer differs from a material of the adhesive layer so that a boundary surface forms where the molding layer and the adhesive layer contact each other;
an interposer mounted on the adhesive layer and the molding layer, wherein the interposer includes an interposer substrate; and
a conductive pillar disposed on the package substrate, wherein the conductive pillar surrounds the side of the semiconductor chip and penetrates the molding layer in a vertical direction and connects the package substrate to the interposer substrate.

2. The semiconductor package of claim 1, wherein the adhesive layer comprises:
a first adhesive portion interposed between the package substrate and the semiconductor chip and that covers the chip connection terminal;
a second adhesive portion disposed adjacent to the side of the semiconductor chip; and
a third adhesive portion interposed between the semiconductor chip and the interposer substrate.

3. The semiconductor package of claim 2, wherein
the interposer substrate includes a trench formed in a bottom portion of the interposer substrate that accommodates at least a portion of the adhesive layer, and
at least a portion of the third adhesive portion of the adhesive layer is disposed in the trench.

4. The semiconductor package of claim 1, wherein the adhesive layer comprises a material that softens but does not completely dissolve or melt when heat is applied thereto.

5. The semiconductor package of claim 4, wherein the adhesive layer comprises a die adhesive film (DAF).

6. The semiconductor package of claim 1, wherein a top surface of the adhesive layer, a top surface of the molding layer, and a bottom surface of the interposer substrate are coplanar.

7. The semiconductor package of claim 1, wherein
the interposer substrate comprises:
an interposer insulating layer;
an interposer substrate pattern that extends in the interposer insulating layer; and
the interposer further comprises:
a first interposer substrate pad disposed on a bottom surface of the interposer insulating layer, is connected to the interposer substrate pattern, and is in contact with the conductive pillar; and
a second interposer substrate pad disposed on the top surface of the interposer insulating layer and is connected to the interposer substrate pattern.

8. The semiconductor package of claim 7, wherein the interposer further comprises a plurality of interposers between the bottom surface of the interposer substrate and the semiconductor chip and that are spaced apart in a horizontal direction.

* * * * *